(12) United States Patent
Sakisaka et al.

(10) Patent No.: US 7,859,364 B2
(45) Date of Patent: Dec. 28, 2010

(54) LAYERED LOW-PASS FILTER

(75) Inventors: Yasunori Sakisaka, Tokyo (JP);
Yukitoshi Kagaya, Tokyo (JP)

(73) Assignee: TDK Corporation, Tokyo (JP)

( * ) Notice: Subject to any disclaimer, the term of this patent is extended or adjusted under 35 U.S.C. 154(b) by 227 days.

(21) Appl. No.: 12/010,277

(22) Filed: Jan. 23, 2008

(65) Prior Publication Data
US 2008/0180192 A1   Jul. 31, 2008

(30) Foreign Application Priority Data
Jan. 30, 2007   (JP) .............................. 2007-018734

(51) Int. Cl.
*H03H 7/00*   (2006.01)
(52) U.S. Cl. ...................... 333/185; 333/177
(58) Field of Classification Search .................. 333/177, 333/184, 185
See application file for complete search history.

(56) References Cited

U.S. PATENT DOCUMENTS

| 5,602,517 A | * | 2/1997 | Kaneko et al. .............. 333/185 |
| 5,977,845 A | * | 11/1999 | Kitahara ..................... 333/184 |
| 6,911,890 B2 | | 6/2005 | Satoh et al. |
| 2003/0043759 A1 | | 3/2003 | Yamaguchi |
| 2006/0038635 A1 | * | 2/2006 | Richiuso et al. ............. 333/177 |

FOREIGN PATENT DOCUMENTS

| JP | A-10-13180 | 1/1998 |
| JP | A 2002-204136 | 7/2002 |
| JP | A 2003-158437 | 5/2003 |
| JP | A-2004-96388 | 3/2004 |
| JP | A-2006-311203 | 11/2006 |

* cited by examiner

*Primary Examiner*—Robert Pascal
*Assistant Examiner*—Kimberly E Glenn
(74) *Attorney, Agent, or Firm*—Oliff & Berridge, PLC

(57) ABSTRACT

A layered low-pass filter includes: a first coil and a second coil that are connected in series and that are located between an input terminal and an output terminal in terms of circuit configuration; and a capacitor located between a ground and a node between the first and second coils in terms of circuit configuration. In terms circuit configuration, the first coil is located closer to the input terminal than is the second coil. Each of the first and second coils has an input and an output. The layered low-pass filter further includes: a first conducting path formed using at least one through hole and used for connecting the capacitor to the output of the first coil; and a second conducting path formed using at least one through hole and used for connecting the capacitor to the input of the second coil.

5 Claims, 23 Drawing Sheets

LAYERED LOW-PASS FILTER

BACKGROUND OF THE INVENTION

1. Field of the Invention

The present invention relates to a layered low-pass filter including two coils that are provided within a layered substrate and connected in series to each other.

2. Description of the Related Art

Recently, there have been strong demands for reductions in size and thickness of electronic apparatuses for portable use typified by cellular phones and notebook personal computers, and accordingly, reductions in size and thickness have also been required for electronic components for use in such electronic apparatuses. Low-pass filters are one of the electronic components for use in such electronic apparatuses. Reductions in size and thickness are also required for low-pass filters. To meet this, it has been proposed to configure a low-pass filter using a layered substrate, as disclosed in JP 2002-204136A and JP 2003-158437A, for example. A low-pass filter configured using a layered substrate as mentioned above will be hereinafter called a layered low-pass filter.

To obtain a steep attenuation characteristic with a low-pass filter, the low-pass filter should preferably be of the fifth order or higher. A fifth-order low-pass filter includes, for example, a first coil and a second coil connected in series to each other, a first capacitor provided between the ground and the node between the two coils, a second capacitor provided between the ground and an end of the first coil opposite to the node, and a third capacitor provided between the ground and an end of the second coil opposite to the node.

Elliptic (simultaneous Chebyshev) low-pass filters are known as being capable of providing a steeper attenuation characteristic. Elliptic low-pass filters present at least one attenuation pole in the stop band in the pass attenuation characteristic. JP 2002-204136A discloses a layered low-pass filter having a circuit configuration of a fifth-order elliptic low-pass filter. The layered low-pass filter disclosed in JP 2002-204136A presents two attenuation poles in the stop band in the pass attenuation characteristic.

JP 2003-158437A discloses a layered LC filter including a low-pass filter circuit and a trap circuit. In this LC filter, the low-pass filter circuit has two inductors connected in series between an input terminal and an output terminal. Each of the inductors is configured by connecting a columnar inductor formed using via holes and a coil conductor pattern in series to each other. The trap circuit has an inductor and a capacitor connected in series between the ground and the node between the two inductors of the low-pass filter circuit. The inductor of the trap circuit is formed using via holes.

For devices incorporating low-pass filters, there may be cases where it is required that the spurious, such as harmonics, of signals passing through the low-pass filter be reduced. In such cases, a notch filter for reducing the spurious can be connected in series to the low-pass filter. However, this causes the problem of an increase in insertion loss in the pass band of the low-pass filter.

A possible solution to this is to employ a type of low-pass filters that present attenuation poles like the elliptic type and make use of the attenuation poles to thereby reduce the spurious. When an attempt is made to implement this with a layered low-pass filter having a plurality of coils connected in series, the following problem is encountered, however. In a layered low-pass filter having a plurality of coils connected in series, as disclosed in JP 2002-204136A, coupling occurs between the coils. The coupling occurring between the coils is magnetic field coupling. If magnetic field coupling occurs between the coils, the two attenuation poles become farther from each other, compared with a case where no magnetic field coupling occurs between the coils. This makes it difficult to increase attenuation at frequencies at which a greater attenuation is desired.

In the layered LC filter disclosed in JP 2003-158437A, magnetic field coupling presumably occurs between the two coil conductor patterns. On the other hand, there seems to occur no magnetic field coupling between the two columnar inductors in this LC filter because a capacitor pattern connected to the ground is provided between the two columnar inductors.

OBJECT AND SUMMARY OF THE INVENTION

It is an object of the present invention to provide a layered low-pass filter including two coils connected in series to each other, the low-pass filter presenting an attenuation pole in the stop band in the pass attenuation characteristic, and capable of providing a greater attenuation at the attenuation pole.

A layered low-pass filter of the present invention includes: a layered substrate including a plurality of dielectric layers stacked; an input terminal provided on the periphery of the layered substrate and receiving signals; an output terminal provided on the periphery of the layered substrate and outputting signals; a first coil and a second coil each of which is formed using at least one conductor layer provided within the layered substrate, the first and second coils being connected in series to each other and, in terms of circuit configuration, located between the input terminal and the output terminal; and a capacitor formed within the layered substrate and, in terms of circuit configuration, located between a ground and a node between the first and second coils. The layered low-pass filter presents at least one attenuation pole in the stop band in the pass attenuation characteristic. In terms of circuit configuration, the first coil is located closer to the input terminal than is the second coil. Each of the first and second coils has an input for receiving signals and an output for outputting signals.

The layered low-pass filter of the present invention further includes: a first conducting path that is formed using at least one through hole provided within the layered substrate and that is used for connecting the capacitor to the output of the first coil; and a second conducting path that is formed using at least one through hole provided within the layered substrate and that is used for connecting the capacitor to the input of the second coil. The first conducting path and the second conducting path are arranged such that the directions of currents flowing through them are opposite to each other, and are magnetic-field-coupled to each other.

According to the layered low-pass filter of the present invention, the first conducting path and the second conducting path are magnetic-field-coupled to each other and the directions of currents flowing through the first and second conducting paths are opposite to each other. By having such first and second conducting paths, the layered low-pass filter of the present invention is capable of providing a greater attenuation at the attenuation pole appearing in the stop band in the pass attenuation characteristic, compared with a case where the capacitor and the node between the first and second coils are connected to each other without any such first and second conducting paths interposed therebetween.

In the layered low-pass filter of the present invention, the first coil and the second coil may be aligned side by side in a direction orthogonal to the direction of a central axis of each of the first and second conducting paths, and may each extend in such a manner as to rotate in a direction from the input toward the output. The direction of rotation of the first coil from the input toward the output and the direction of rotation of the second coil from the input toward the output may be opposite to each other.

In the layered low-pass filter of the present invention, any conductor layer other than conductor layers connected to the first and second conducting paths is preferably not located between the first and second conducting paths.

The layered low-pass filter of the present invention may further include a third conducting path that is formed using at least one through hole provided within the layered substrate and that is used for connecting the capacitor to an end of each of the first and second conducting paths closer to the capacitor. In this case, the first and second conducting paths may have equal lengths, and the third conducting path may have a length equal to or smaller than one-half of the length of each of the first and second conducting paths.

The layered low-pass filter of the present invention may further include a capacitor located between the input of the first coil and the ground, a capacitor located between the output of the second coil and the ground, a capacitor connected in parallel to the first coil, and a capacitor connected in parallel to the second coil.

According to the layered low-pass filter of the present invention, the provision of the first and second conducting paths allows an increase in attenuation at the attenuation pole appearing in the stop band in the pass attenuation characteristic.

Other and further objects, features and advantages of the invention will appear more fully from the following description.

DESCRIPTION OF THE PREFERRED EMBODIMENTS

First Embodiment

Figure 4:
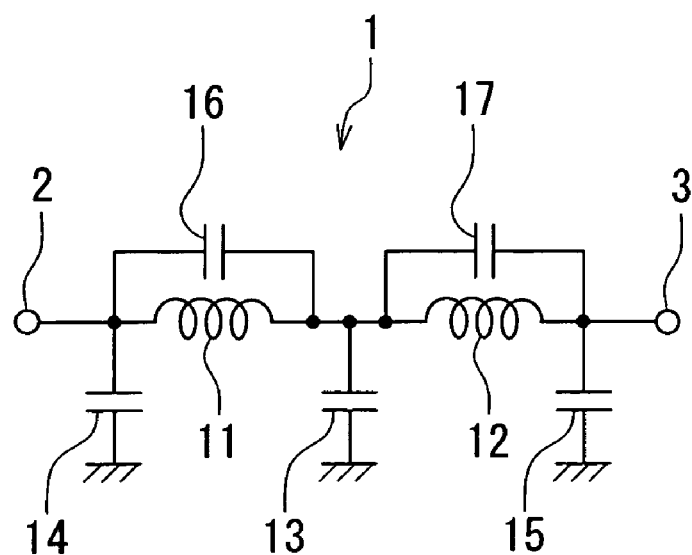
FIG. 4 is a circuit diagram illustrating the circuit configuration of the layered low-pass filter according to the first embodiment of the invention.

Preferred embodiments of the present invention will now be described in detail with reference to the drawings. Reference is first made to FIG. 4 to describe the circuit configuration of a layered low-pass filter according to a first embodiment of the invention. As illustrated in FIG. 4, the layered low-pass filter 1 according to the first embodiment includes: an input terminal 2 for receiving signals; an output terminal 3 for outputting signals; two coils 11 and 12; and five capacitors 13 to 17.

The coils 11 and 12 are connected in series to each other and, in terms of circuit configuration, located between the input terminal 2 and the output terminal 3. In terms of circuit configuration, the coil 11 is located closer to the input terminal 2 than is the coil 12. The coil 11 corresponds to the first coil of the present invention while the coil 12 corresponds to the second coil of the present invention. Each of the coils 11 and 12 has an input for receiving signals and an output for outputting signals. The input of the coil 11 is connected to the input terminal 2. The output of the coil 11 is connected to the input of the coil 12. The output of the coil 12 is connected to the output terminal 3. It should be noted that the expression "in terms of circuit configuration" used herein is intended to mean a layout in a circuit diagram, not in a physical configuration.

In terms of circuit configuration, the capacitor 13 is located between the ground and the node between the coils 11 and 12. Specifically, an end of the capacitor 13 is connected to the node between the coils 11 and 12, while the other end of the capacitor 13 is connected to the ground.

The capacitor 14 is located between the input of the coil 11 and the ground. Specifically, an end of the capacitor 14 is connected to the input of the coil 11 while the other end of the capacitor 14 is connected to the ground. The capacitor 15 is located between the output of the coil 12 and the ground. Specifically, an end of the capacitor 15 is connected to the output of the coil 12 while the other end of the capacitor 15 is connected to the ground.

The capacitor 16 is connected in parallel to the coil 11. Specifically, an end of the capacitor 16 is connected to the input of the coil 11 while the other end of the capacitor 16 is connected to the output of the coil 11. The capacitor 17 is connected in parallel to the coil 12. Specifically, an end of the capacitor 17 is connected to the input of the coil 12 while the other end of the capacitor 17 is connected to the output of the coil 12.

The layered low-pass filter 1 has a circuit configuration of a fifth-order inverse Chebyshev or fifth-order elliptic low-pass filter. In the layered low-pass filter 1, when signals are received at the input terminal 2, those at frequencies equal to or lower than a specific cut-off frequency selectively pass through the layered low-pass filter 1 and are outputted from the output terminal 3. This layered low-pass filter 1 presents at least one attenuation pole in the stop band in the pass attenuation characteristic.

Figure 1:
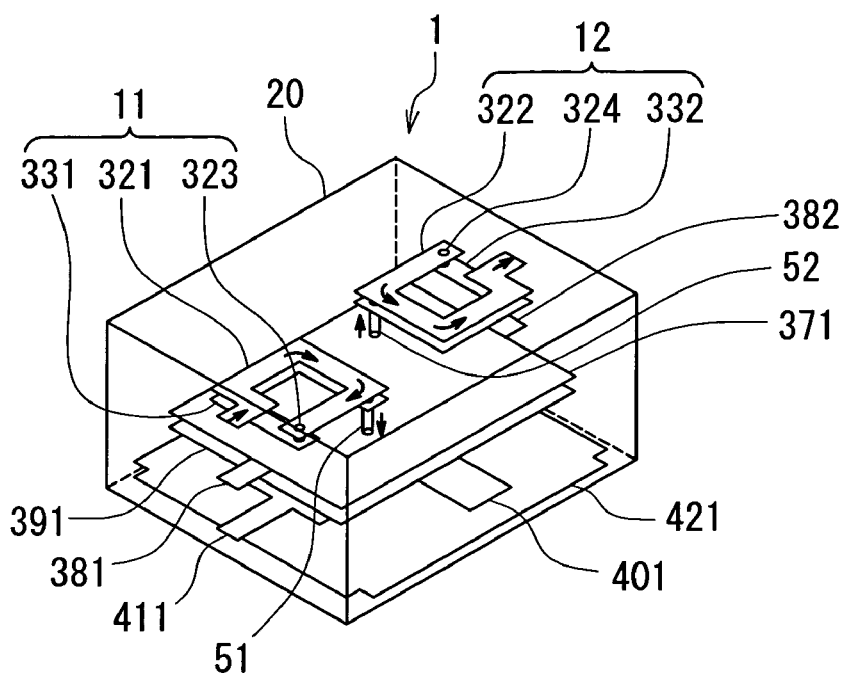
FIG. 1 is a perspective view illustrating the main part of a layered low-pass filter according to a first embodiment of the invention.
Figure 2:
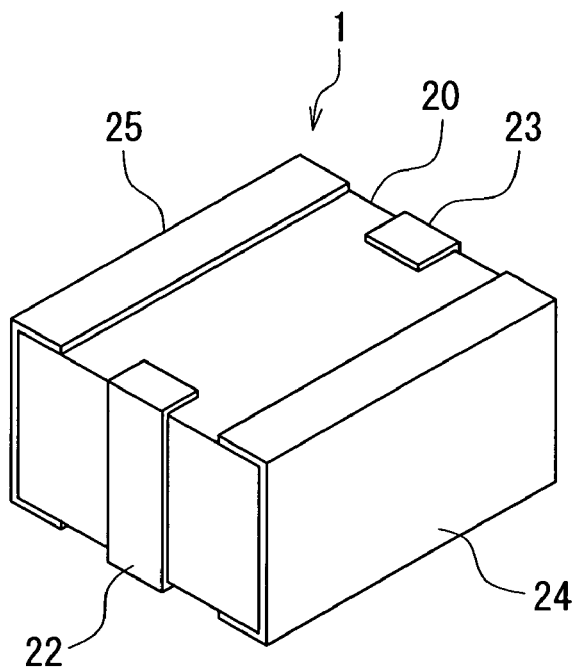
FIG. 2 is a perspective view illustrating the outer appearance of the layered low-pass filter according to the first embodiment of the invention.

Reference is now made to FIG. 1 and FIG. 2 to describe an outline of the structure of the layered low-pass filter 1. FIG. 1 is a perspective view illustrating the main part of the layered low-pass filter 1. FIG. 2 is a perspective view illustrating the outer appearance of the layered low-pass filter 1.

The layered low-pass filter 1 has a layered substrate 20 for integrating the components of the layered low-pass filter 1. The layered substrate 20 includes a plurality of dielectric layers and a plurality of conductor layers stacked, which will be described in more detail later. Each of the coils 11 and 12 is formed using at least one of the conductor layers located within the layered substrate 20. Each of the capacitors 13 to 17 is formed within the layered substrate 20 by using at least two of the conductor layers within the layered substrate 20 and a dielectric layer located between the two conductor layers.

As illustrated in FIG. 2, the layered substrate 20 is shaped like a rectangular solid and has a top surface, a bottom surface and four side surfaces, as the periphery. An input terminal 22 is located on one of the side surfaces, while an output terminal 23 is located on the opposite one. Ground terminals 24 and 25 are respectively located on the remaining two side surfaces of the layered substrate 20. The input terminal 22 corresponds to the input terminal 2 of FIG. 4, and the output terminal 23 corresponds to the output terminal 3 of FIG. 4. The ground terminals 24 and 25 are connected to the ground. In the layered substrate 20, the ridgeline between the top surface and the side surface on which the terminal 24 is located may be 0.8 to 2.7 mm long; the ridgeline between the top surface and the side surface on which the terminal 22 is located may be 0.4 to 2.2 mm long; and the ridgeline between the side surface on which the terminal 22 is located and the side surface on which the terminal 24 is located may be 0.2 to 1.2 mm long, for example.

Figure 5A:
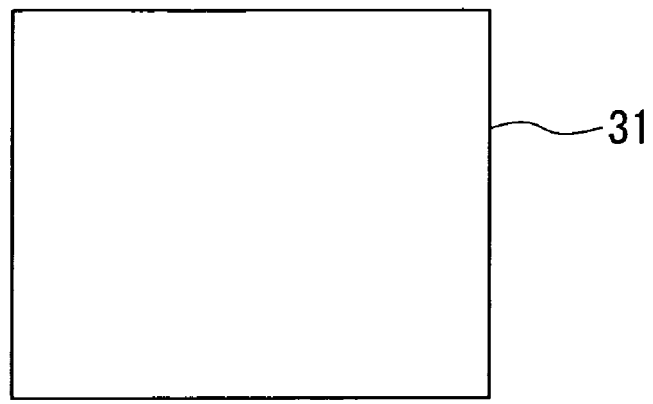
FIG. 5A to FIG. 5C are views illustrating the top surfaces of first to third dielectric layers of the layered substrate of the first embodiment of the invention.
Figure 5B:
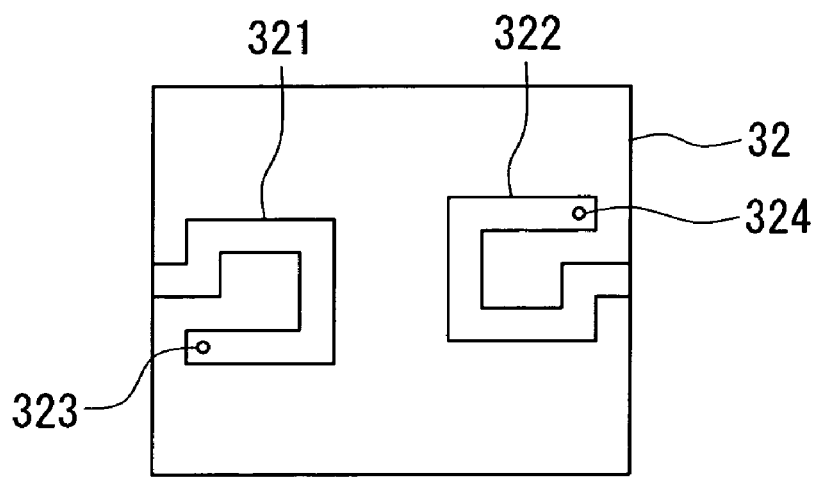
Figure 6A:
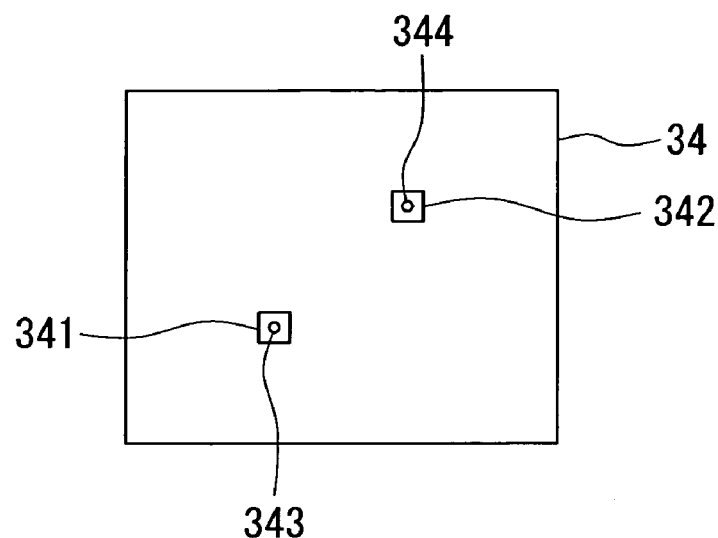
FIG. 6A to FIG. 6C are views illustrating the top surfaces of fourth to sixth dielectric layers of the layered substrate of the first embodiment of the invention.
Figure 6B:
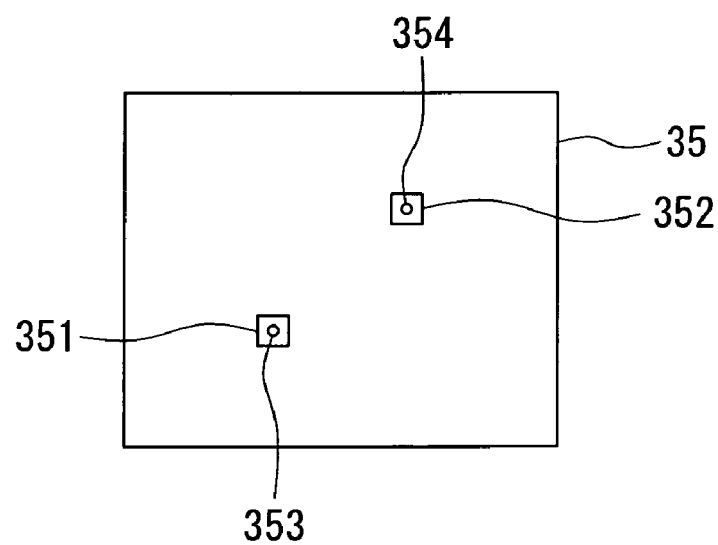
Figure 6C:
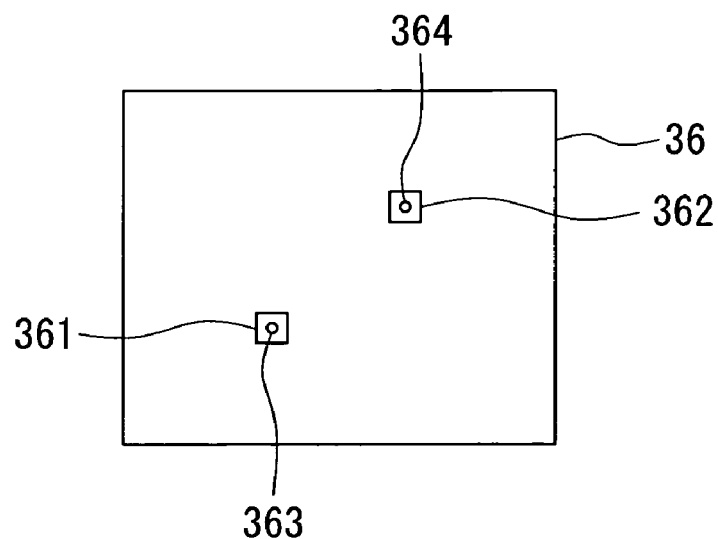
Figure 7A:
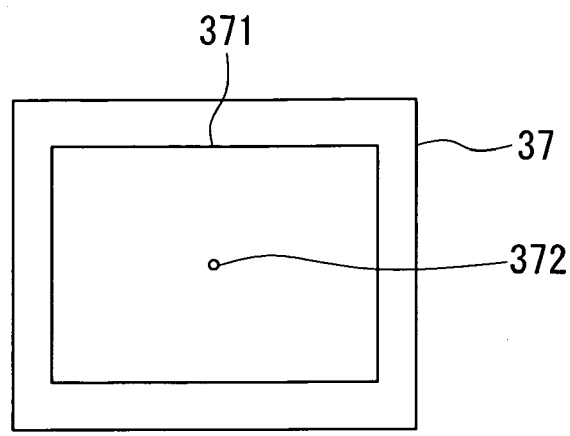
FIG. 7A to FIG. 7C are views illustrating the top surfaces of seventh to ninth dielectric layers of the layered substrate of the first embodiment of the invention.
Figure 7B:
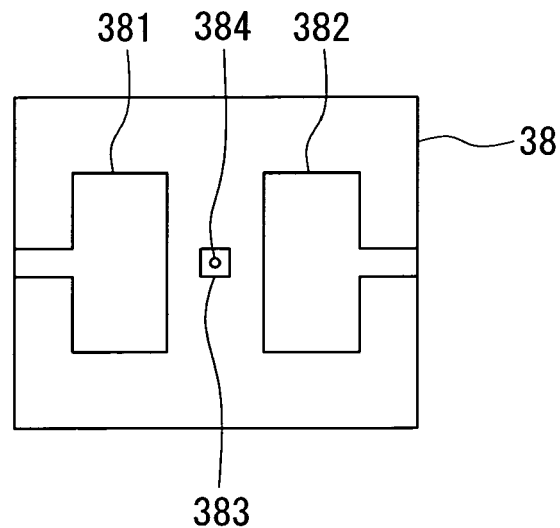
Figure 7C:
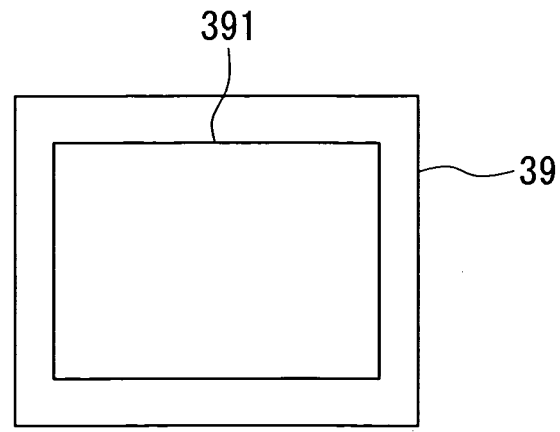
Figure 8A:
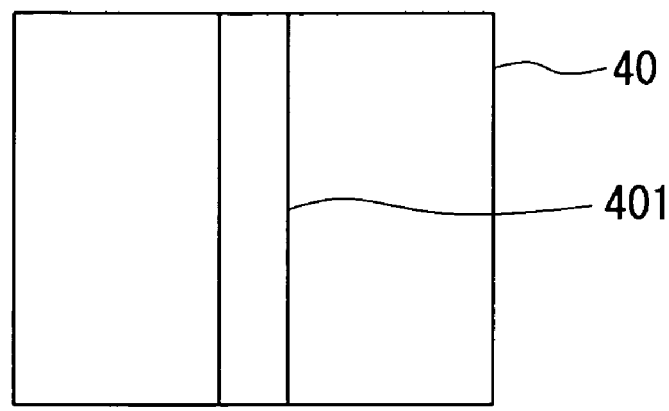
FIG. 8A to FIG. 8C are views illustrating the top surfaces of tenth to twelfth dielectric layers of the layered substrate of the first embodiment of the invention.
Figure 8B:
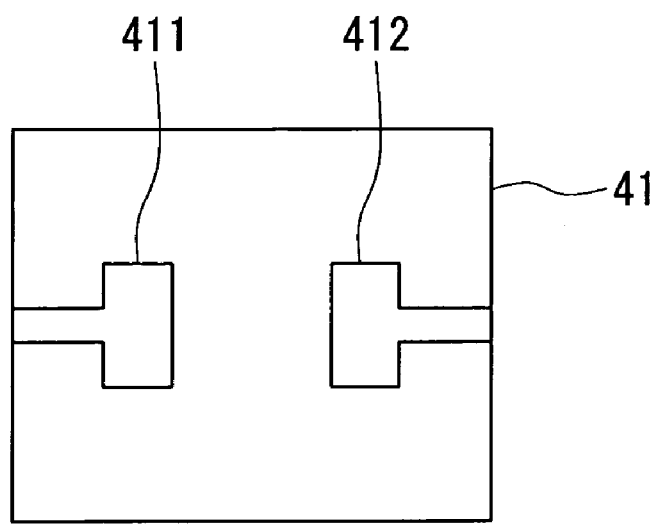
Figure 8C:
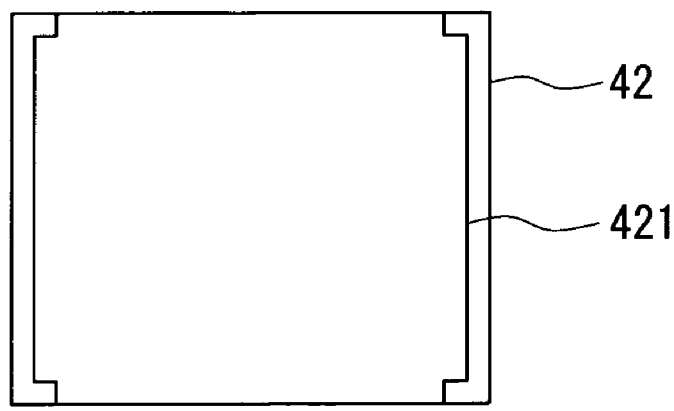

Reference is now made of FIG. 5A to FIG. 8C to describe the dielectric layers and conductor layers of the layered substrate 20 in detail. FIG. 5A to FIG. 5C respectively illustrate the top surfaces of the first to third dielectric layers from the top. FIG. 6A to FIG. 6C respectively illustrate the top surfaces of the fourth to sixth dielectric layers from the top. FIG. 7A to FIG. 7C respectively illustrate the top surfaces of the seventh to ninth dielectric layers from the top. FIG. 8A to FIG. 8C respectively illustrate the top surfaces of the tenth to twelfth dielectric layers from the top.

No conductor layer is formed on the top surface of the first dielectric layer 31 of FIG. 5A. On the top surface of the second dielectric layer 32 of FIG. 5B, there are formed a coil conductor layer 321 constituting part of the coil 11 of FIG. 4, and a coil conductor layer 322 constituting part of the coil 12 of FIG. 4. One end of the conductor layer 321 is connected to the input terminal 22. This end of the conductor layer 321 forms the input of the coil 11. As seen from above, the conductor layer 321 extends in such a manner as to rotate in a clockwise direction from the one end toward the other end. One end of the conductor layer 322 is connected to the output terminal 23. This end of the conductor layer 322 forms the output of the coil 12. As seen from above, the conductor layer 322 extends in such a manner as to rotate in a counterclockwise direction from the one end toward the other end.

The dielectric layer 31 has a through hole 323 connected to a portion of the conductor layer 321 near its other end, and a through hole 324 connected to a portion of the conductor layer 322 near its other end.

Figure 5C:
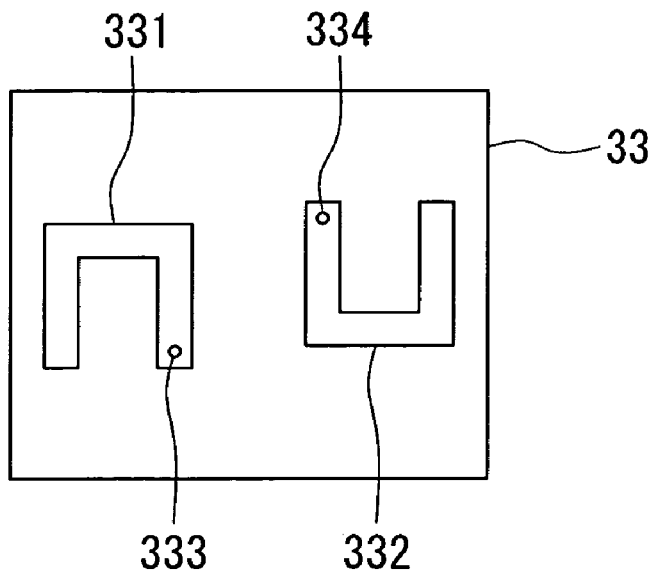

On the top surface of the third dielectric layer 33 of FIG. 5C, there are formed a coil conductor layer 331 constituting another part of the coil 11 and a coil conductor layer 332 constituting another part of the coil 12. The through hole 323 is connected to a portion of the conductor layer 331 near its one end. As seen from above, the conductor layer 331 extends in such a manner as to rotate in a clockwise direction from its one end toward its other end. The through hole 324 is connected to a portion of the conductor layer 332 near its one end.

As seen from above, the conductor layer 332 extends in such a manner as to rotate in a clockwise direction from its one end toward its other end.

The dielectric layer 32 has a through hole 333 connected to a portion of the conductor layer 331 near its other end, and a through hole 334 connected to a portion of the conductor layer 332 near its other end. The portion of the conductor layer 331 connected to the through hole 333 forms the output of the coil 11. The portion of the conductor layer 332 connected to the through hole 334 forms the input of the coil 12.

The coil 11 is formed using the conductor layers 321 and 331 and the through hole 323. As seen from above, the coil 11 extends in such a manner as to rotate in a clockwise direction from the input toward the output. The coil 12 is formed using the conductor layers 322 and 332 and the through hole 324. As seen from above, the coil 12 extends in such a manner as to rotate in a counterclockwise direction from the input toward the output. Thus, the direction of rotation of the coil 11 from the input toward the output and the direction of rotation of the coil 12 from the input toward the output are opposite to each other.

On the top surface of the fourth dielectric layer 34 of FIG. 6A, there are formed conductor layers 341 and 342. The dielectric layer 34 has a through hole 343 connected to the conductor layer 341, and a through hole 344 connected to the conductor layer 342. The through holes 343 and 344 are connected to the through holes 333 and 334, respectively.

On the top surface of the fifth dielectric layer 35 of FIG. 6B, there are formed conductor layers 351 and 352. The dielectric layer 35 has a through hole 353 connected to the conductor layer 351, and a through hole 354 connected to the conductor layer 352. The through holes 353 and 354 are connected to the through holes 343 and 344, respectively.

On the top surface of the sixth dielectric layer 36 of FIG. 6C, there are formed conductor layers 361 and 362. The dielectric layer 36 has a through hole 363 connected to the conductor layer 361, and a through hole 364 connected to the conductor layer 362. The through holes 363 and 364 are connected to the through holes 353 and 354, respectively.

On the top surface of the seventh dielectric layer 37 of FIG. 7A, there is formed a capacitor conductor layer 371. The through holes 363 and 364 are connected to the conductor layer 371. The dielectric layer 37 has a through hole 372 connected to the conductor layer 371.

On the top surface of the eighth dielectric layer 38 of FIG. 7B, there are formed a capacitor conductor layers 381 and 382 and a conductor layer 383. The conductor layer 381 is connected to the input terminal 22. The conductor layer 382 is connected to the output terminal 23. The dielectric layer 38 has a through hole 384 connected to the conductor layer 383. The through hole 384 is connected to the through hole 372.

On the top surface of the ninth dielectric layer 39 of FIG. 7C, there is formed a capacitor conductor layer 391. The through hole 384 is connected to the conductor layer 391.

On the top surface of the tenth dielectric layer 40 of FIG. 8A, there is formed a ground conductor layer 401. The conductor layer 401 is connected to the ground terminals 24 and 25. On the top surface of the eleventh dielectric layer 41 of FIG. 8B, there are formed capacitor conductor layers 411 and 412. The conductor layer 411 is connected to the input terminal 22. The conductor layer 412 is connected to the output terminal 23. On the top surface of the twelfth dielectric layer 42 of FIG. 8C, there is formed a ground conductor layer 421. The conductor layer 421 is connected to the ground terminals 24 and 25.

The first to twelfth dielectric layers 31 to 42 and the conductor layers described above are stacked to form the layered substrate 20 illustrated in FIG. 1 and FIG. 2. The terminals 22 to 25 of FIG. 2 are formed on the periphery of the layered substrate 20.

In this embodiment, various types of substrates can be employed as the layered substrate 20, such as one in which the dielectric layers are made of resin, ceramic, or a resin-ceramic composite material. However, a low-temperature co-fired ceramic multilayer substrate which is excellent in high frequency response is particularly preferable as the layered substrate 20.

Figure 3:
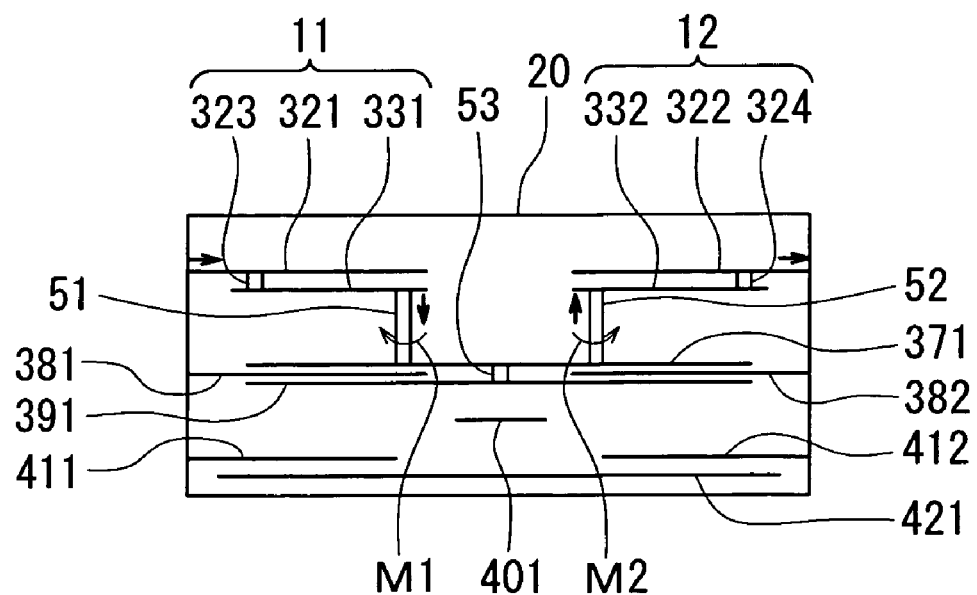
FIG. 3 is a view illustrating the inside of the layered substrate of the first embodiment of the invention.

A further description will now be made on the internal configuration of the layered substrate 20 with reference to FIG. 3. FIG. 3 is a view illustrating the inside of the layered substrate 20 as viewed from the side surface on which the terminal 24 is located. As previously described, the coil 11 is formed using the conductor layers 321 and 331 and the through hole 323. The coil 12 is formed using the conductor layers 322 and 332 and the through hole 324.

The conductor layers 381 and 382 of FIG. 7B are opposed to the conductor layer 371 with the dielectric layer 37 located in between, and are also opposed to the conductor layer 391 with the dielectric layer 38 located in between. The capacitor 16 of FIG. 4 is composed of the conductor layers 371, 381 and 391 and the dielectric layers 37 and 38. The capacitor 17 of FIG. 4 is composed of the conductor layers 371, 382 and 391 and the dielectric layers 37 and 38.

The conductor layer 391 of FIG. 7C is connected to the conductor layer 371 via the through holes 372 and 384. The conductor layer 371 is connected to the conductor layer 331 via the through holes 333, 343, 353 and 363. The conductor layer 371 is also connected to the conductor layer 332 via the through holes 334, 344, 354 and 364. The conductor layer 391 is opposed to the conductor layer 401 with the dielectric layer 39 located in between. The capacitor 13 of FIG. 4 is composed of the conductor layers 391 and 401 and the dielectric layer 39 located between them.

The through holes 333, 343, 353 and 363 constitute a first conducting path 51 used for connecting the capacitor 13 to the output of the coil 11. The through holes 334, 344, 354 and 364 constitute a second conducting path 52 used for connecting the capacitor 13 to the input of the coil 12. The through holes 372 and 384 constitute a third conducting path 53 used for connecting the capacitor 13 to an end of each of the first and second conducting paths 51 and 52 closer to the capacitor 13. The coils 11 and 12 are aligned side by side in a direction orthogonal to the directions of the central axes of the conducting paths 51 and 52.

The conductor layers 411 and 412 of FIG. 8B are opposed to the conductor layer 421 with the dielectric layer 41 located in between. The capacitor 14 of FIG. 4 is composed of the conductor layers 411 and 421 and the dielectric layer 41 located between them. The capacitor 15 of FIG. 4 is composed of the conductor layers 412 and 421 and the dielectric layer 41 located between them.

The coils 11 and 12 and the conducting paths 51 and 52 of the layered low-pass filter 1 will now be described in more detail with reference to FIG. 1 and FIG. 3. Arrows in FIG. 1 show the directions of currents flowing through the coils 11 and 12 and the conducting paths 51 and 52. In FIG. 3 the arrow marked with M1 shows the direction of the magnetic field generated by the current flowing through the conducting path 51, while the arrow marked with M2 shows the direction of the magnetic field generated by the current flowing through the conducting path 52. The other arrows in FIG. 3 show the directions of the currents flowing through the coils 11 and 12 and the conducting paths 51 and 52.

As illustrated in FIG. 1 and FIG. 3, the conducting paths 51 and 52 are arranged such that the directions of their central axes are parallel to each other and the directions of the currents flowing through them are opposite to each other. Consequently, the direction (direction of rotation) of the magnetic field generated by the current flowing through the conducting path 51 and the direction (direction of rotation) of the magnetic field generated by the current flowing through the conducting path 52 are opposite to each other. Furthermore, the conducting paths 51 and 52 are magnetic-field-coupled to each other. In order not to interfere with the magnetic field coupling between the conducting paths 51 and 52, any conductor layer other than the conductor layers connected to the conducting paths 51 and 52 is not located between the conducting paths 51 and 52. The conducting paths 51 and 52 are equal in length. The third conducting path 53 preferably has a length equal to or smaller than one-half of the length of each of the conducting paths 51 and 52.

Figure 9:
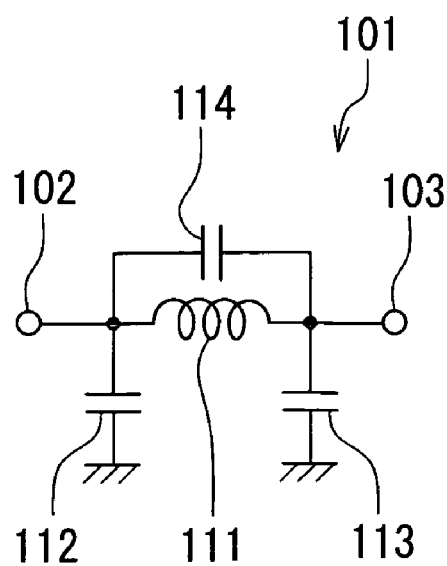
FIG. 9 is a circuit diagram illustrating the circuit configuration of a third-order low-pass filter.

The functions and effects of the layered low-pass filter 1 according to the first embodiment will now be described. First, a description will be given of the characteristic of the layered low-pass filter 1. As illustrated in FIG. 4, the layered low-pass filter 1 has a circuit configuration of a fifth-order inverse Chebyshev or fifth-order elliptic low-pass filter. The circuit configuration of the low-pass filter of FIG. 4 corresponds to a configuration obtained by cascade-connecting two of third-order low-pass filter 101 of FIG. 9. The low-pass filter 101 of FIG. 9 includes an input 102, an output 103, a coil 111 provided between the input 102 and the output 103, a capacitor 112 provided between the input 102 and the ground, a capacitor 113 provided between the output 103 and the ground, and a capacitor 114 connected in parallel to the coil 111. The low-pass filter 101 of FIG. 9 presents a single attenuation pole in the stop band in the pass attenuation characteristic. A fifth-order inverse Chebyshev or fifth-order elliptic low-pass filter, which corresponds to a combination of two low-pass filters 101 cascade-connected to each other, generally presents two attenuation poles in the stop band in the pass attenuation characteristic. Each of the two attenuation poles corresponds to the single attenuation pole of the low-pass filter 101. Conventionally, when a fifth-order inverse Chebyshev or fifth-order elliptic low-pass filter is configured using a layered substrate, it is difficult to match the frequencies of the two attenuation poles to thereby provide a single attenuation pole instead of the two attenuation poles. This is considered to be because magnetic field coupling occurs between the two coils.

Figure 10:
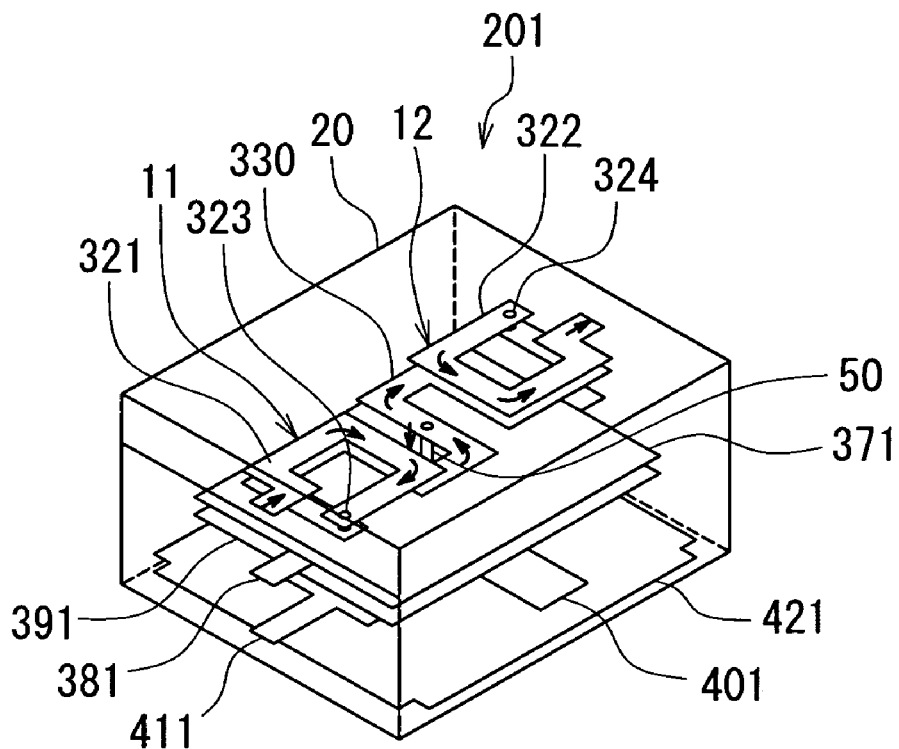
FIG. 10 is a perspective view illustrating the main part of a layered low-pass filter of a comparative example against the first embodiment of the invention.
Figure 11:
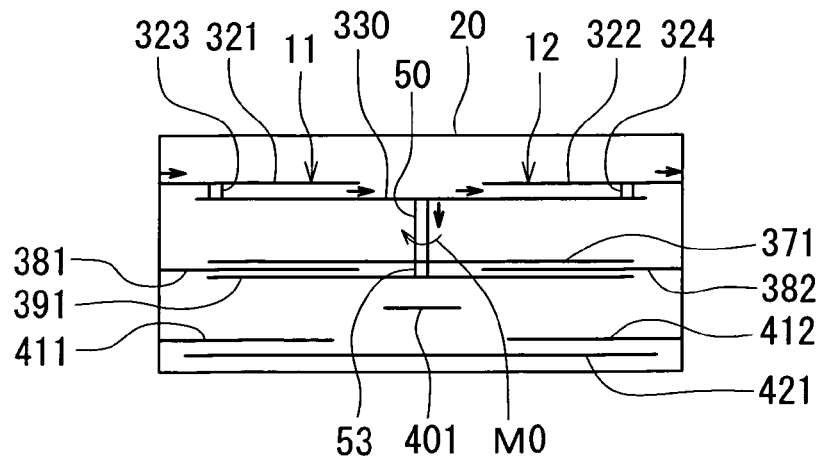
FIG. 11 is a view illustrating the inside of the layered substrate of the layered low-pass filter of the comparative example against the first embodiment of the invention.

Reference is now made to FIG. 10 and FIG. 11 to describe a layered low-pass filter 201 of a comparative example against the first embodiment. FIG. 10 is a perspective view illustrating the main part of the layered low-pass filter 201 of the comparative example. FIG. 11 is a view illustrating the inside of the layered substrate 20 of the layered low-pass filter 201 as viewed from the side surface on which the terminal 24 is located. The layered low-pass filter 201 of the comparative example has a single conductor layer 330 formed on the dielectric layer 33, in place of the conductor layers 331 and 332 of the layered low-pass filter 1 according to the first embodiment. The conductor layer 330 includes a portion corresponding to the conductor layer 331, a portion corresponding to the conductor layer 332, and a portion connecting the above two portions to each other. In the layered low-pass filter 201 the coil 11 is composed of the conductor layer 321, the through hole 323, and the portion of the conductor layer 330 corresponding to the conductor layer 331. In the layered low-pass filter 201 the coil 12 is composed of the conductor layer 322, the through hole 324, and the portion of the conductor layer 330 corresponding to the conductor layer 332.

The layered low-pass filter 201 has a conducting path 50 for connecting the conductor layers 330 and 371 to each other, in place of the conducting paths 51 and 52 of the layered low-pass filter 1. The conducting path 50 is formed by serially connecting through holes respectively formed one each in the dielectric layers 33, 34, 35 and 36. The conducting path 50 is connected to the conducting path 53. The remainder of configuration of the layered low-pass filter 201 is the same as that of the layered low-pass filter 1.

Arrows in FIG. 10 show the directions of currents flowing through the coils 11 and 12 and the conducting path 50. In FIG. 11 the arrow marked with M0 shows the direction of the magnetic field generated by the current flowing through the conducting path 50. The other arrows in FIG. 11 show the directions of the currents flowing through the coils 11 and 12 and the conducting path 50. As can be seen from FIG. 10 and FIG. 11, conducting paths 51 and 52 in which the directions of currents are opposite to each other do not exist between the capacitor 13 and the coils 11, 12 in the layered low-pass filter 201.

Figure 12:
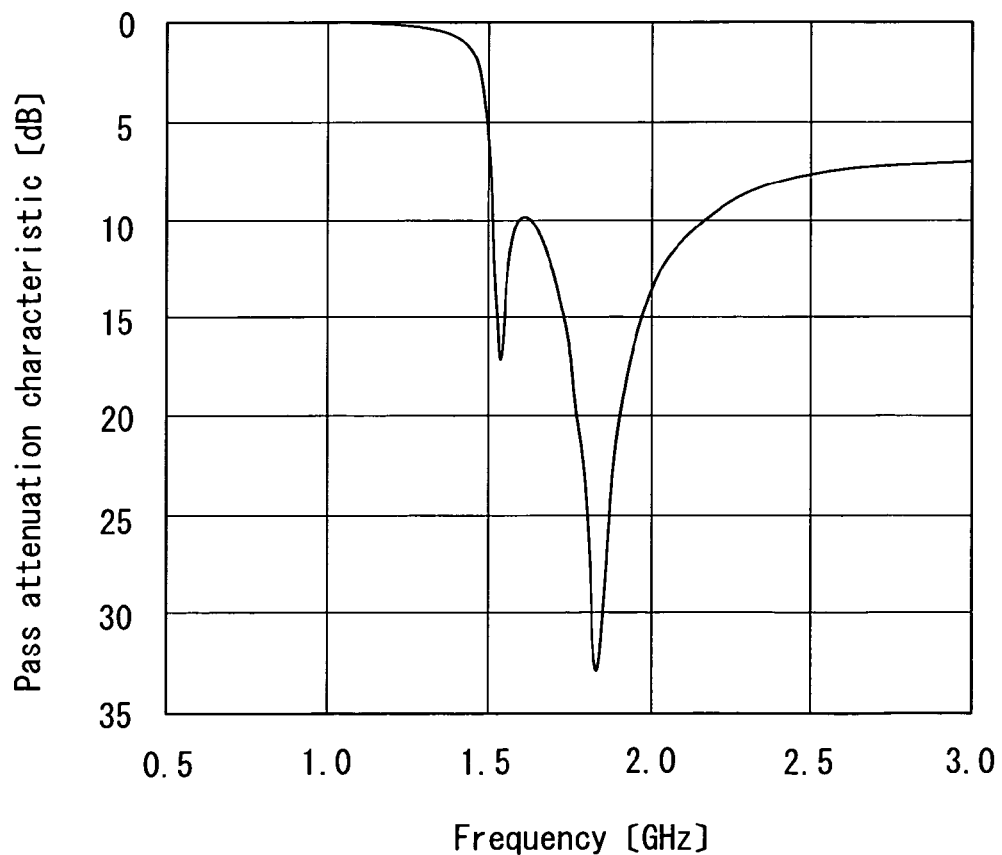
FIG. 12 is a plot illustrating the pass attenuation characteristic of the layered low-pass filter of the comparative example against the first embodiment of the invention.
Figure 13:
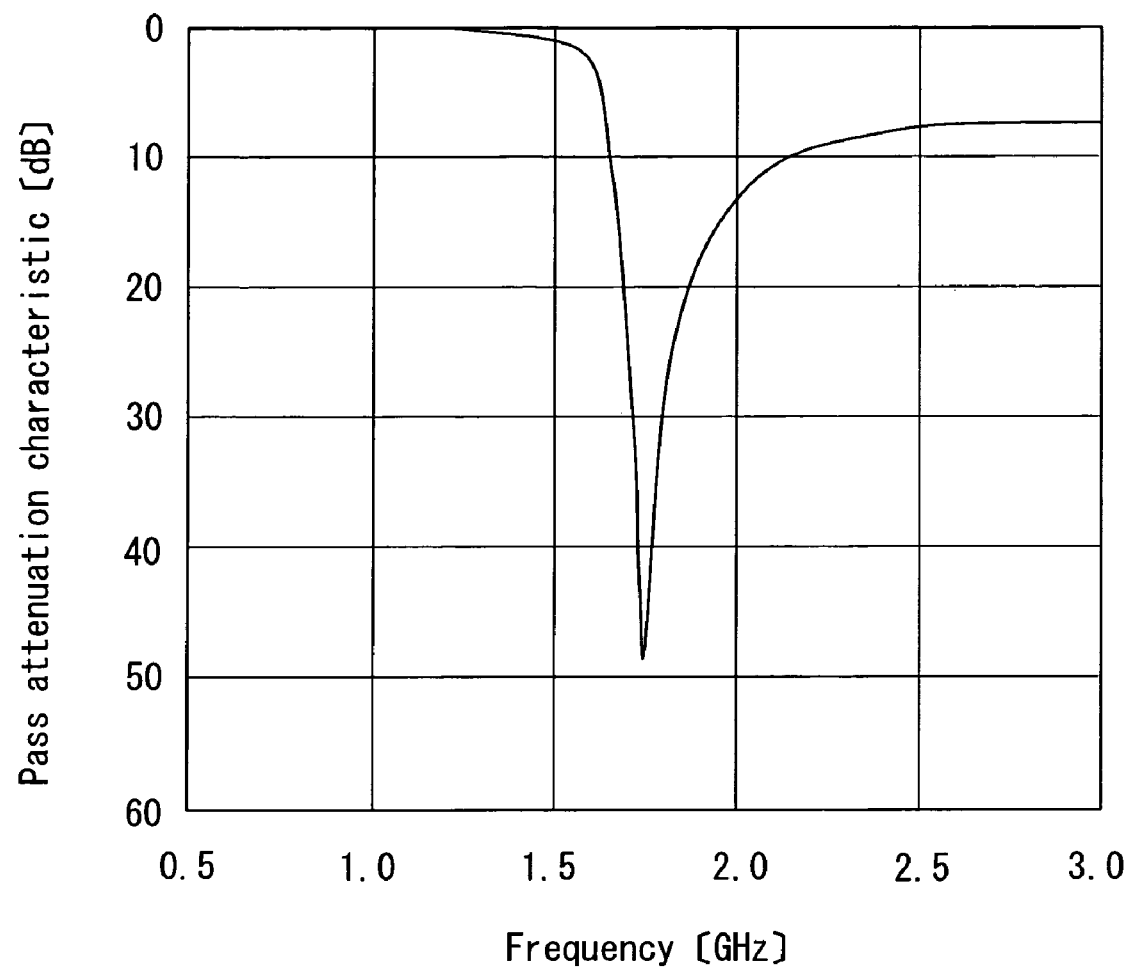
FIG. 13 is a plot illustrating the pass attenuation characteristic of the layered low-pass filter according to the first embodiment of the invention.

A description will now be made on the results of comparison between the pass attenuation characteristic of the layered low-pass filter 1 according to the first embodiment and that of the layered low-pass filter 201 of the comparative example by simulation. FIG. 12 shows the pass attenuation characteristic of the layered low-pass filter 201 of the comparative example. FIG. 13 shows the pass attenuation characteristic of the layered low-pass filter 1 according to the first embodiment. The pass attenuation characteristics shown in FIG. 12 and FIG. 13 were obtained by simulation. FIG. 12 shows that the layered low-pass filter 201 of the comparative example has two attenuation poles in the stop band in the pass attenuation characteristic. In contrast, as shown in FIG. 13, the layered low-pass filter 1 according to the first embodiment has a single attenuation pole in the stop band in the pass attenuation characteristic, and the attenuation obtained at this single attenuation pole is greater than the attenuation obtained at each of the two attenuation poles of the layered low-pass filter 201 of the comparative example.

As the above simulation results indicate, by having the two conducting paths 51 and 52 in which the directions of currents are opposite to each other, the layered low-pass filter 1 according to the first embodiment is capable of providing a greater attenuation at the attenuation pole appearing in the stop band in the pass attenuation characteristic, compared with the case where the capacitor 13 and the node between the coils 11 and 12 are connected via only one conducting path 50 without any such two conducting paths 51 and 52.

Furthermore, according to the embodiment, it is possible to effectively reduce the spurious, such as harmonics, of signals passing through the layered low-pass filter 1 by making use of the attenuation pole, without providing any notch filter in series to the layered low-pass filter 1. Consequently, according to the embodiment, it is possible to prevent an increase in insertion loss in the pass band of the layered low-pass filter 1.

Furthermore, according to the embodiment, it is possible to obtain a great attenuation at the attenuation pole even in the case where magnetic field coupling occurs between two adjacent coils 11 and 12 in response to reductions in size and thickness of the layered low-pass filter 1. It is therefore easy to reduce the size and thickness of the layered low-pass filter 1.

Reference is now made to FIG. 14 to FIG. 20 to describe the results of studying the effects of the distance between the conducting paths 51 and 52 on the pass attenuation characteristic of the layered low-pass filter 1. Here, pass attenuation characteristics were compared among first to third models of the layered low-pass filter 1 by simulation. The first to third models of the layered low-pass filter 1 are different in distance between the conducting paths 51 and 52.

Figure 14:
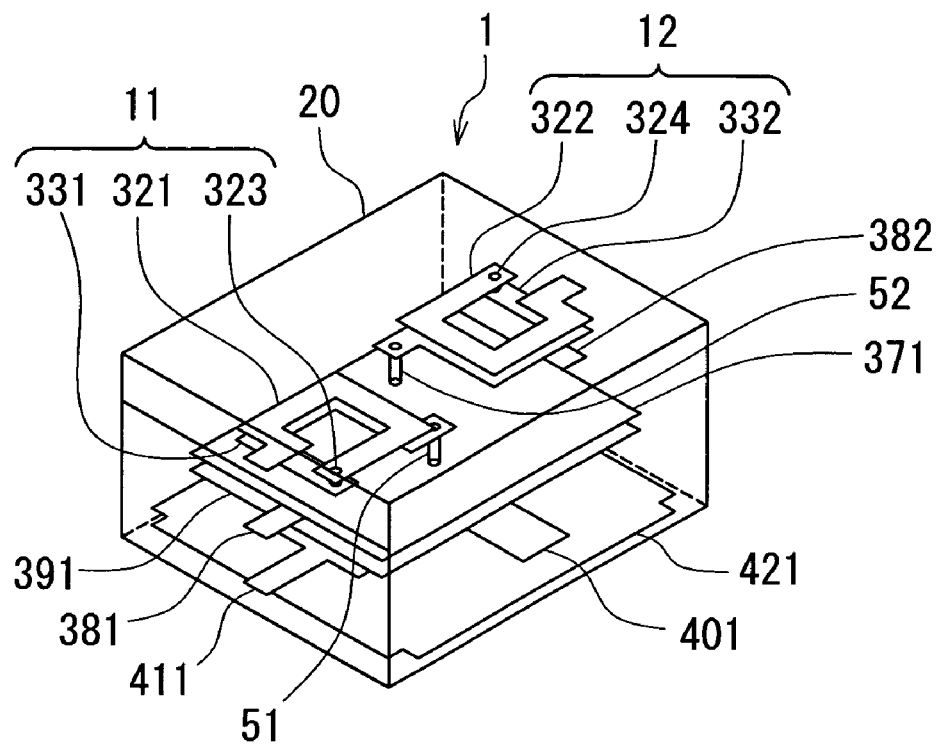
FIG. 14 is a perspective view illustrating the main part of a first model of the layered low-pass filter according to the first embodiment of the invention.
Figure 15:
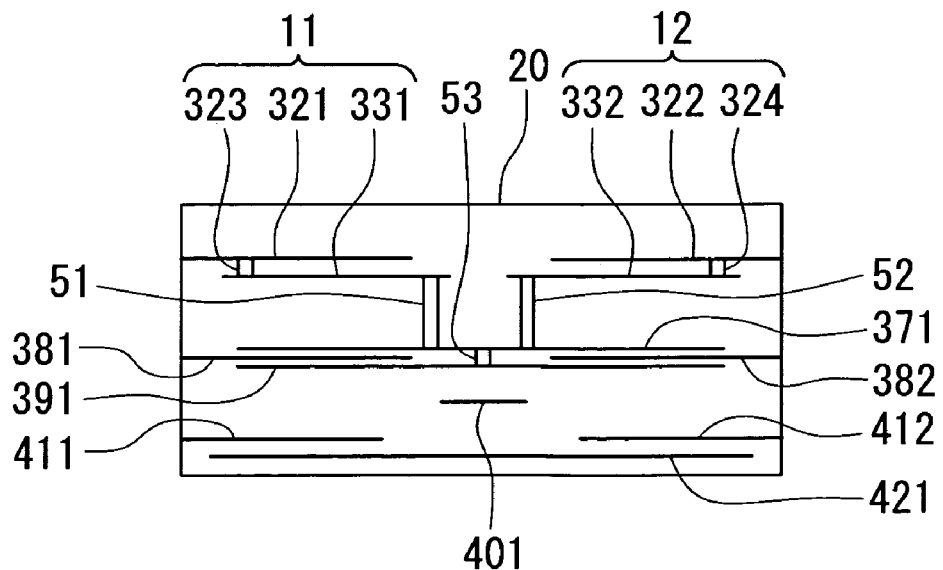
FIG. 15 is a view illustrating the inside of the layered substrate of the first model of the layered low-pass filter according to the first embodiment of the invention.
Figure 16:
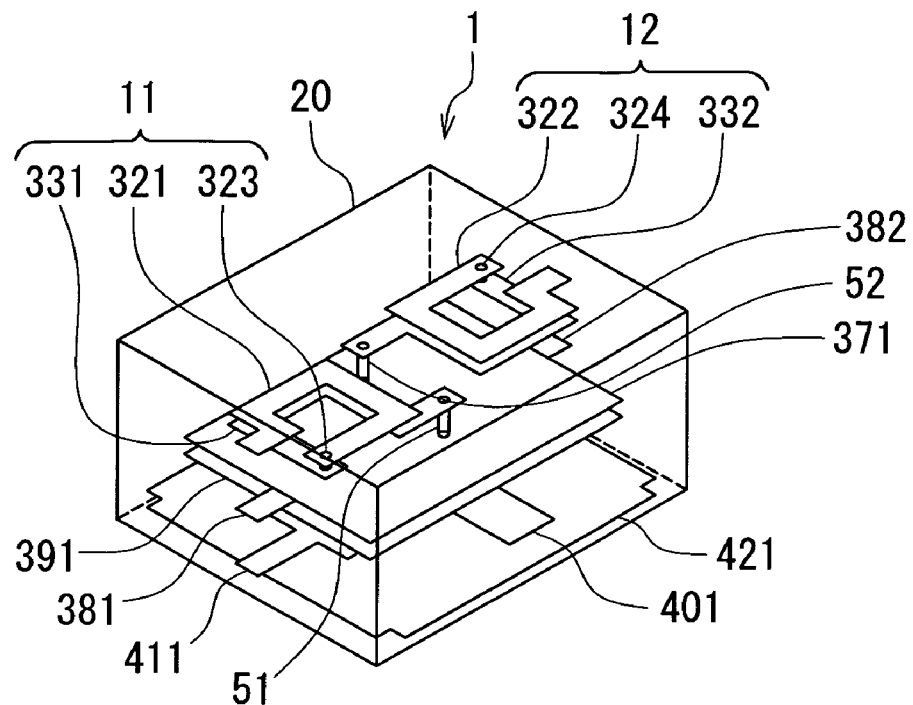
FIG. 16 is a perspective view illustrating the main part of a second model of the layered low-pass filter according to the first embodiment of the invention.
Figure 17:
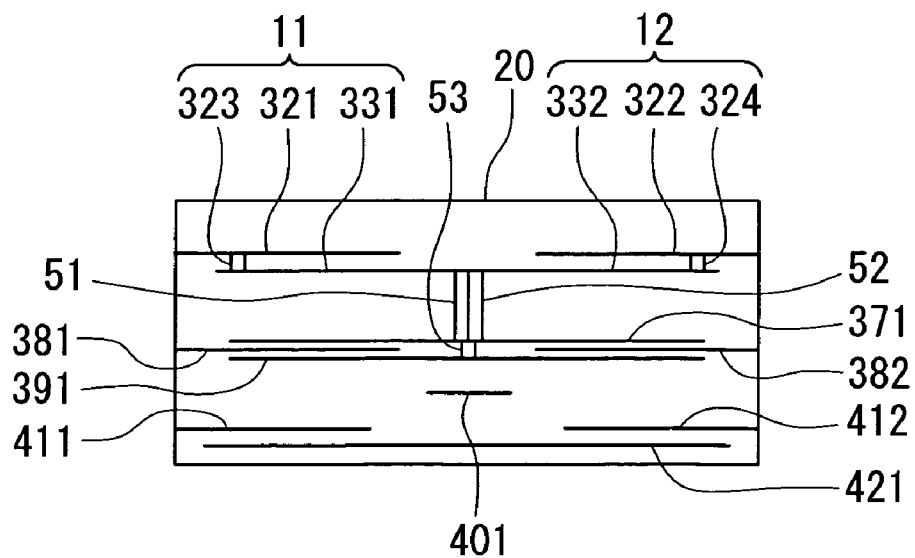
FIG. 17 is a view illustrating the inside of the layered substrate of the second model of the layered low-pass filter according to the first embodiment of the invention.
Figure 18:
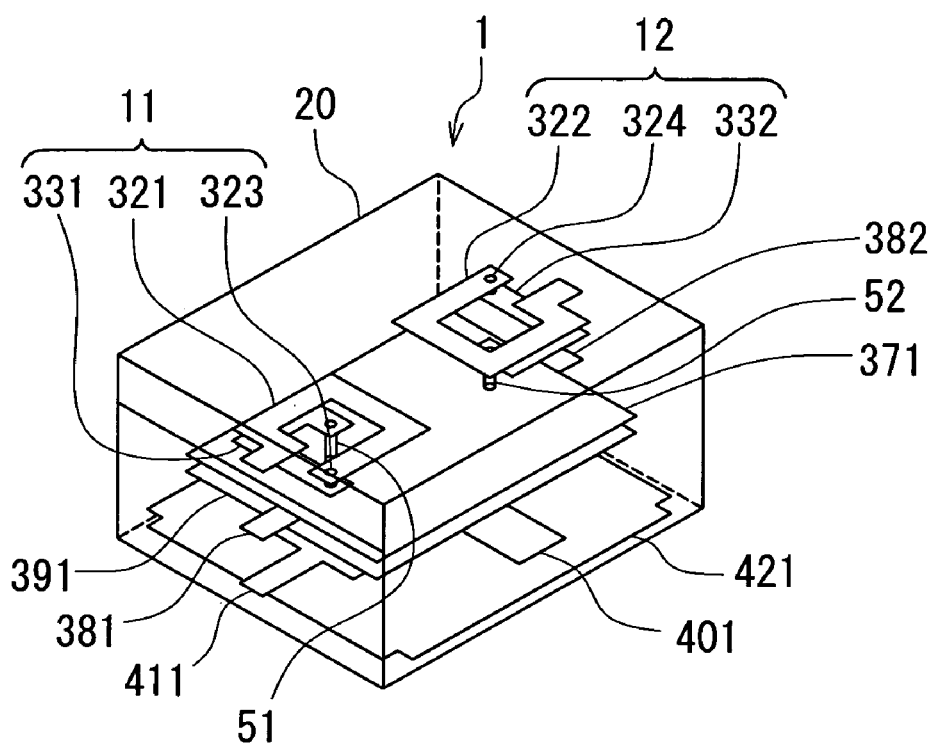
FIG. 18 is a perspective view illustrating the main part of a third model of the layered low-pass filter according to the first embodiment of the invention.
Figure 19:
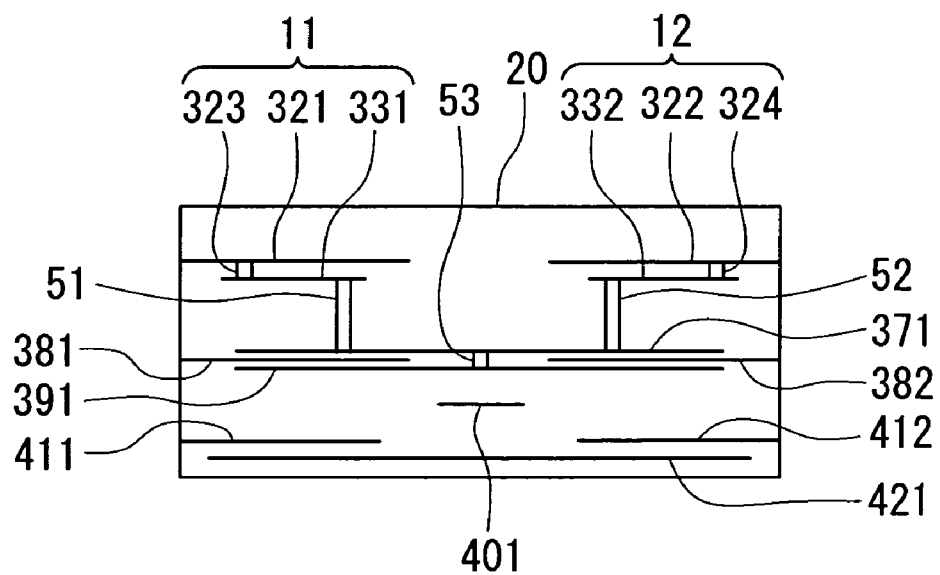
FIG. 19 is a view illustrating the inside of the layered substrate of the third model of the layered low-pass filter according to the first embodiment of the invention.

FIG. 14 is a perspective view illustrating the main part of the first model. FIG. 15 is a view illustrating the inside of the layered substrate 20 of the first model as viewed from the side surface on which the terminal 24 is located. FIG. 16 is a perspective view illustrating the main part of the second model. FIG. 17 is a view illustrating the inside of the layered substrate 20 of the second model as viewed from the side surface on which the terminal 24 is located. FIG. 18 is a perspective view illustrating the main part of the third model. FIG. 19 is a view illustrating the inside of the layered substrate 20 of the third model as viewed from the side surface on which the terminal 24 is located.

The first to third models are different in locations of the conducting paths 51 and 52, and are accordingly different in distance between the conducting paths 51 and 52 and in lengths of the conductor layers 331 and 332. In the second model, the distance between the conducting paths 51 and 52 is smaller while the lengths of the conductor layer 331 and 332 are greater, compared with the first model. In the third model, the distance between the conducting paths 51 and 52 is greater while the lengths of the conductor layer 331 and 332 are smaller, compared with the first model.

Figure 20:
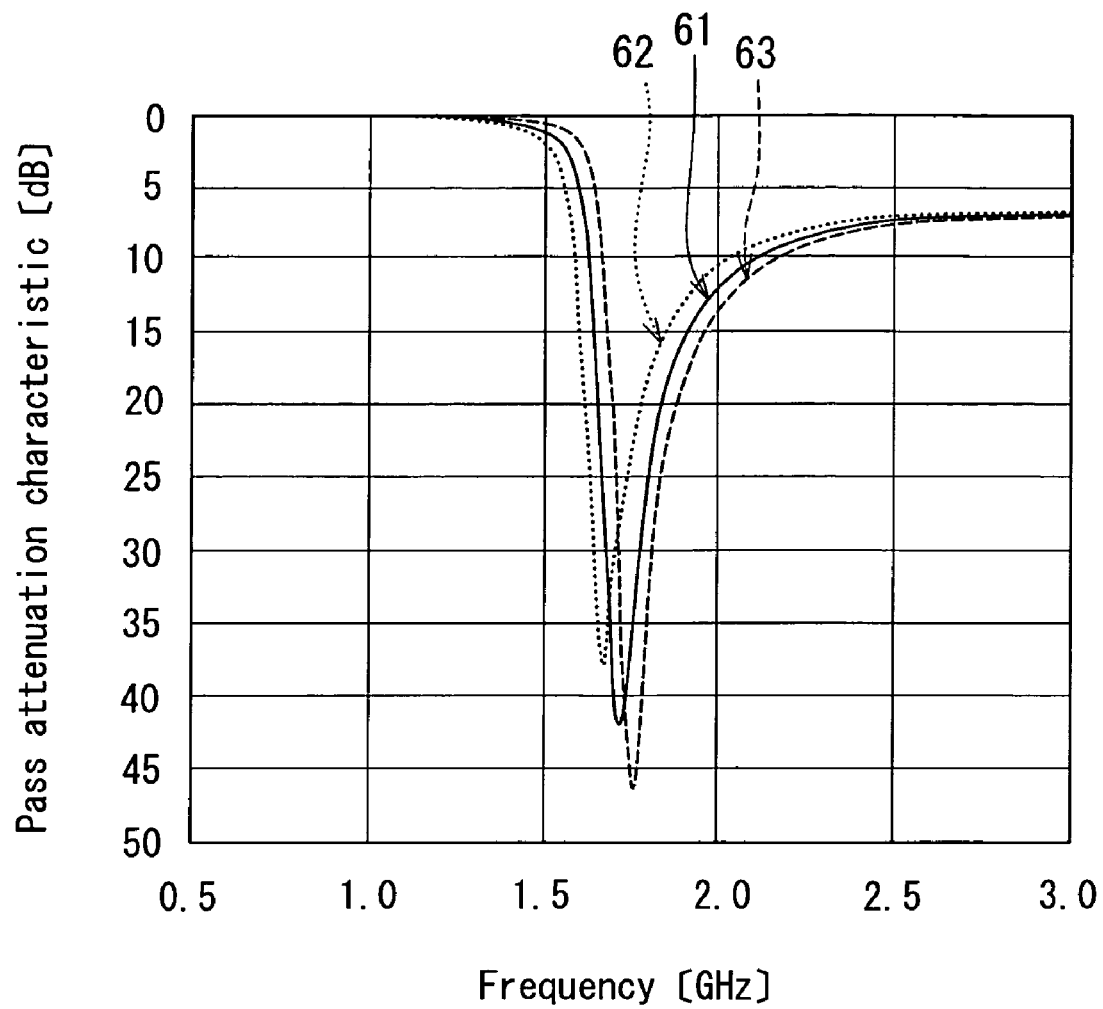
FIG. 20 is a plot illustrating the pass attenuation characteristics of the first to third models of the layered low-pass filter according to the first embodiment of the invention.

FIG. 20 shows the pass attenuation characteristics of the first to third models obtained by simulation. In FIG. 20 the solid line with numeral 61 indicates the pass attenuation characteristic of the first model, the dotted line with numeral 62 indicates the pass attenuation characteristic of the second model, and the broken line with numeral 63 indicates the pass attenuation characteristic of the third model. As can be seen from FIG. 20, each of the first to third models has a single attenuation pole in the stop band in the pass attenuation characteristic. The frequencies of the respective attenuation poles of the first to third models are different, however. This is presumably because the lengths of the conductor layers 331 and 332 are different among the first to third models.

As can be seen from the simulation results shown in FIG. 20, according to the embodiment, it is possible to provide only a single attenuation pole in the stop band in the pass attenuation characteristic, irrespective of the distance between the conducting paths 51 and 52, and to obtain a great attenuation at the attenuation pole. This is presumably because, as long as the conducting paths 51 and 52 are located within the layered substrate 20 having the previously described dimensions, magnetic field coupling occurs between the conducting paths 51 and 52 irrespective of the distance between the conducting paths 51 and 52.

Furthermore, in the embodiment, the direction of rotation of the coil 11 from the input toward the output and the direction of rotation of the coil 12 from the input toward the output are opposite to each other. In a third embodiment described later, the direction of rotation of the coil 11 from the input toward the output and the direction of rotation of the coil 12 from the input toward the output are the same. As will be described in detail later in the description of the third embodiment, in the case where the direction of rotation of the coil 11 from the input toward the output and the direction of rotation of the coil 12 from the input toward the output are opposite to each other as in the first embodiment, it is possible to provide a greater attenuation at the attenuation pole, compared with the case where the directions of rotation of the coils are the same.

Second Embodiment

Figure 21:
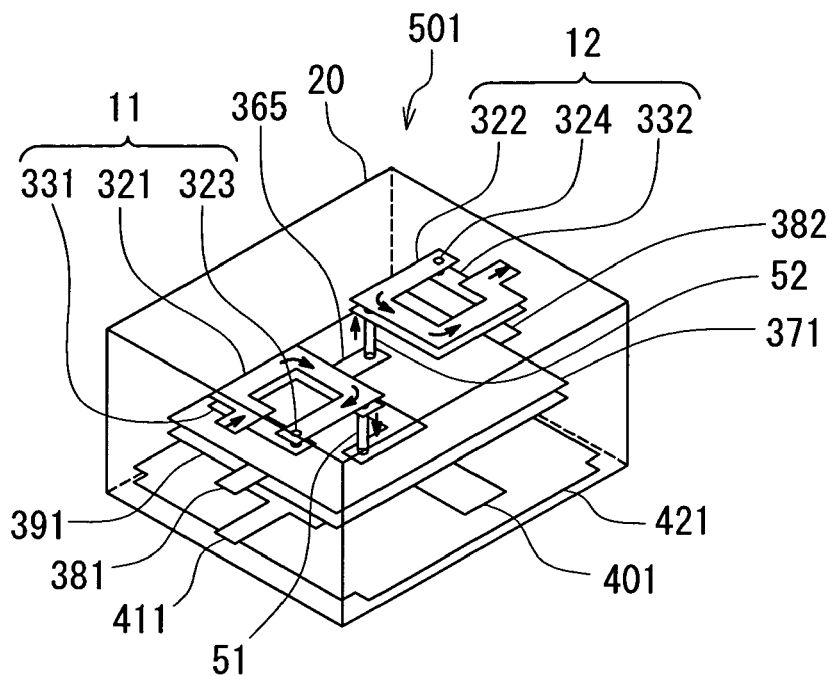
FIG. 21 is a perspective view illustrating the main part of a layered low-pass filter according to a second embodiment of the invention.
Figure 22:
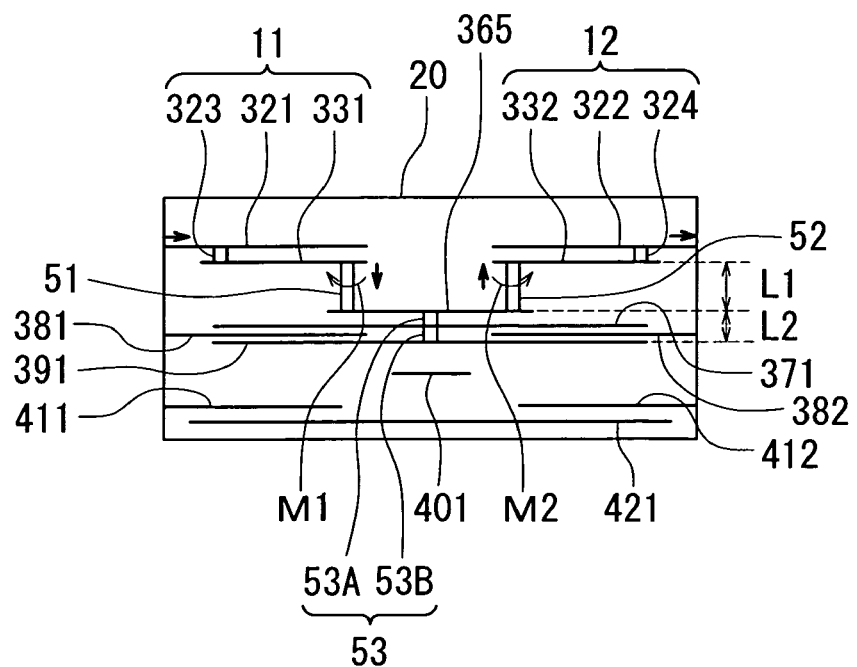
FIG. 22 is a view illustrating the inside of the layered substrate of the layered low-pass filter according to the second embodiment of the invention.
Figure 23:
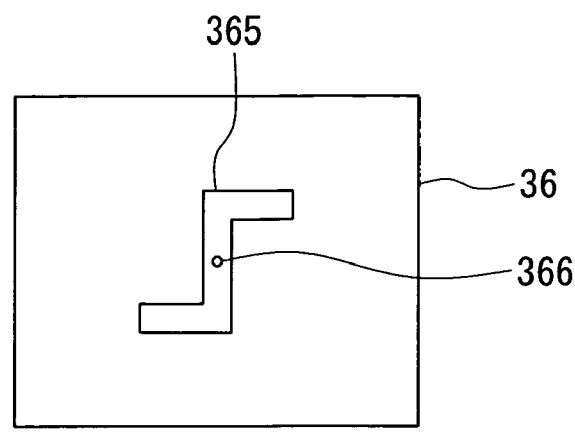
FIG. 23 is a top view illustrating the top surface of one of dielectric layers within the layered substrate of the second embodiment of the invention.
Figure 24:
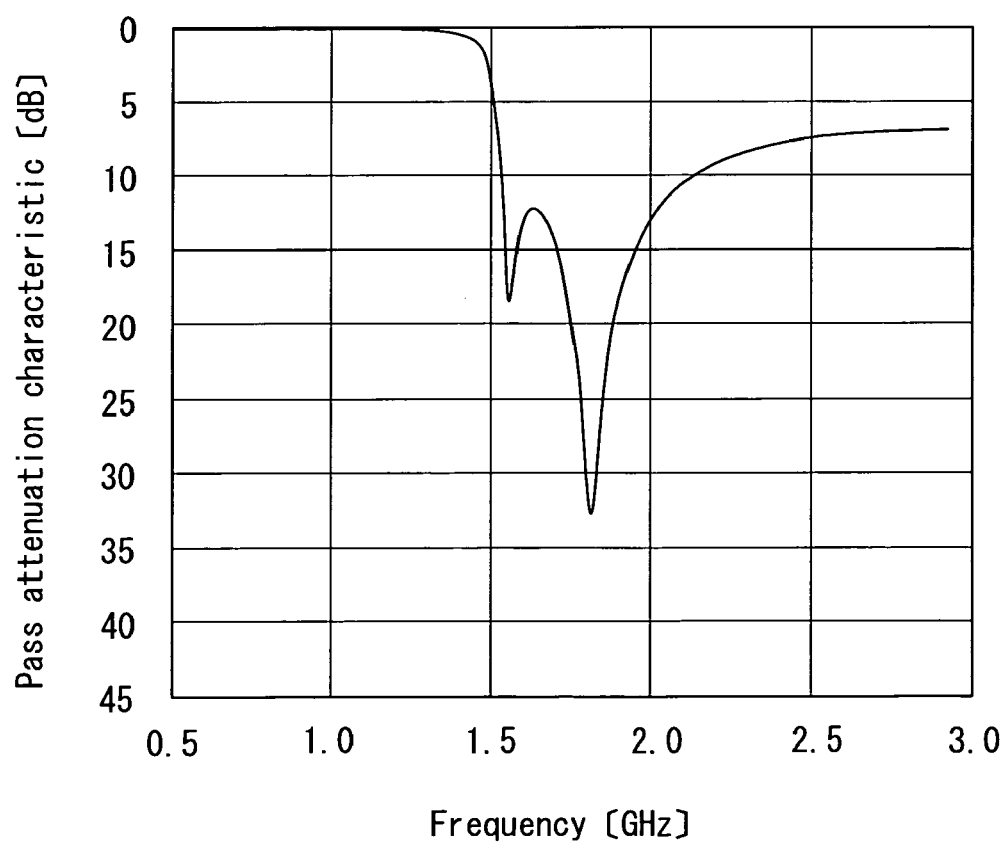
FIG. 24 is a plot illustrating the pass attenuation characteristic of a first model of the layered low-pass filter according to the second embodiment of the invention.
Figure 25:
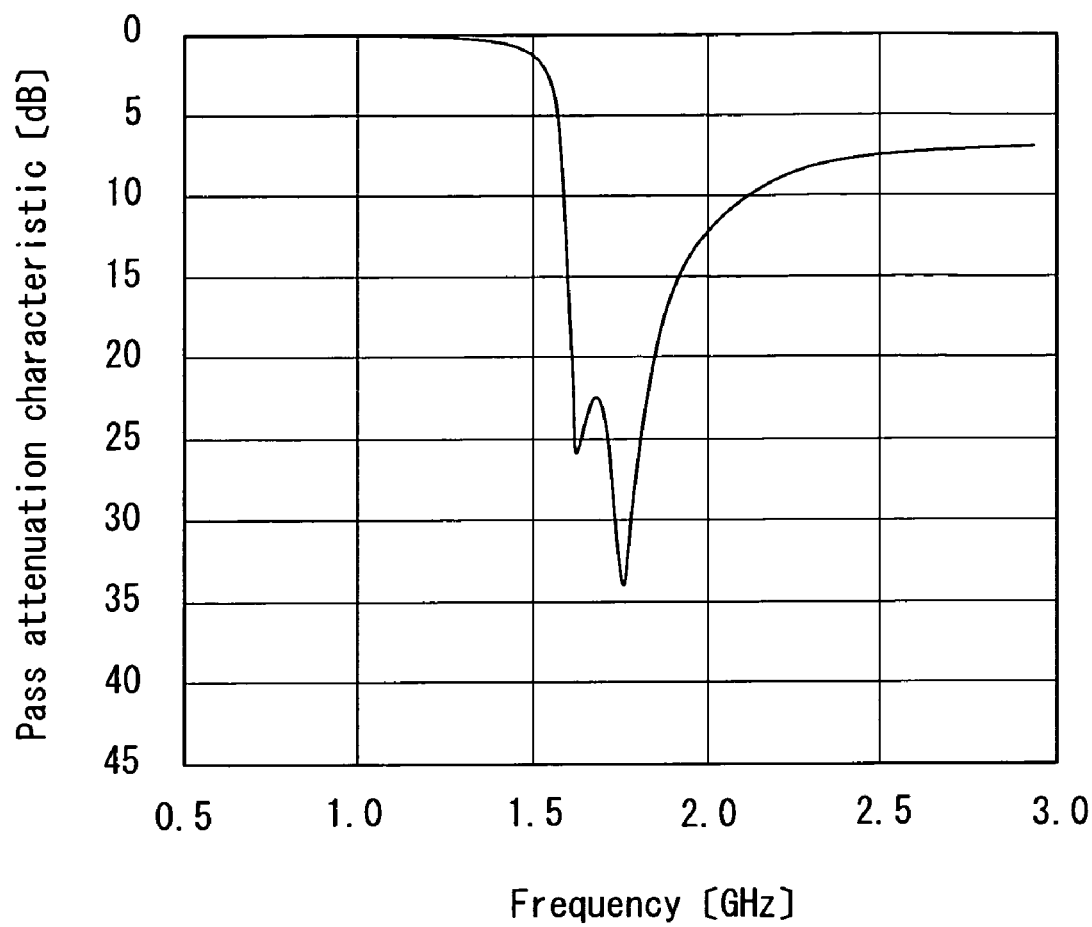
FIG. 25 is a plot illustrating the pass attenuation characteristic of a second model of the layered low-pass filter according to the second embodiment of the invention.
Figure 26:
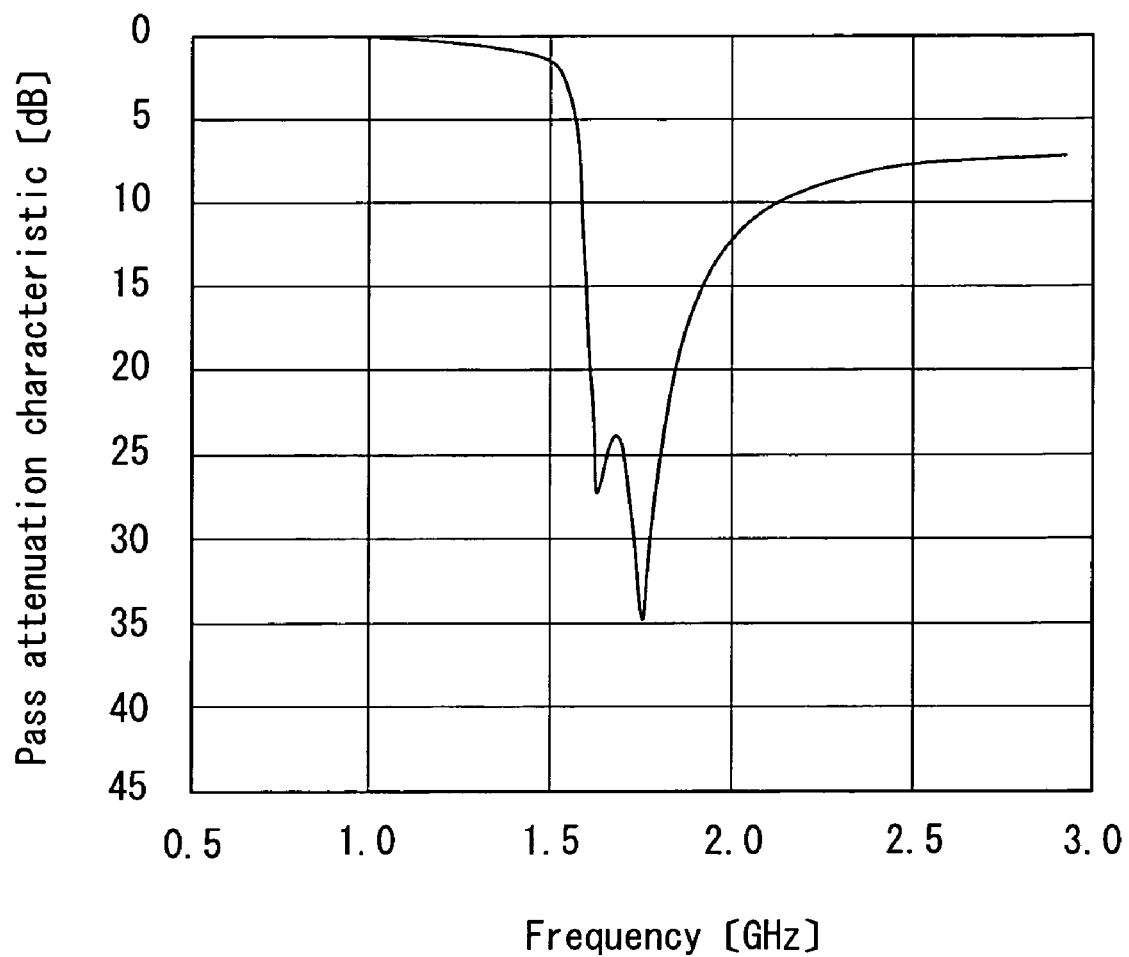
FIG. 26 is a plot illustrating the pass attenuation characteristic of a third model of the layered low-pass filter according to the second embodiment of the invention.
Figure 27:
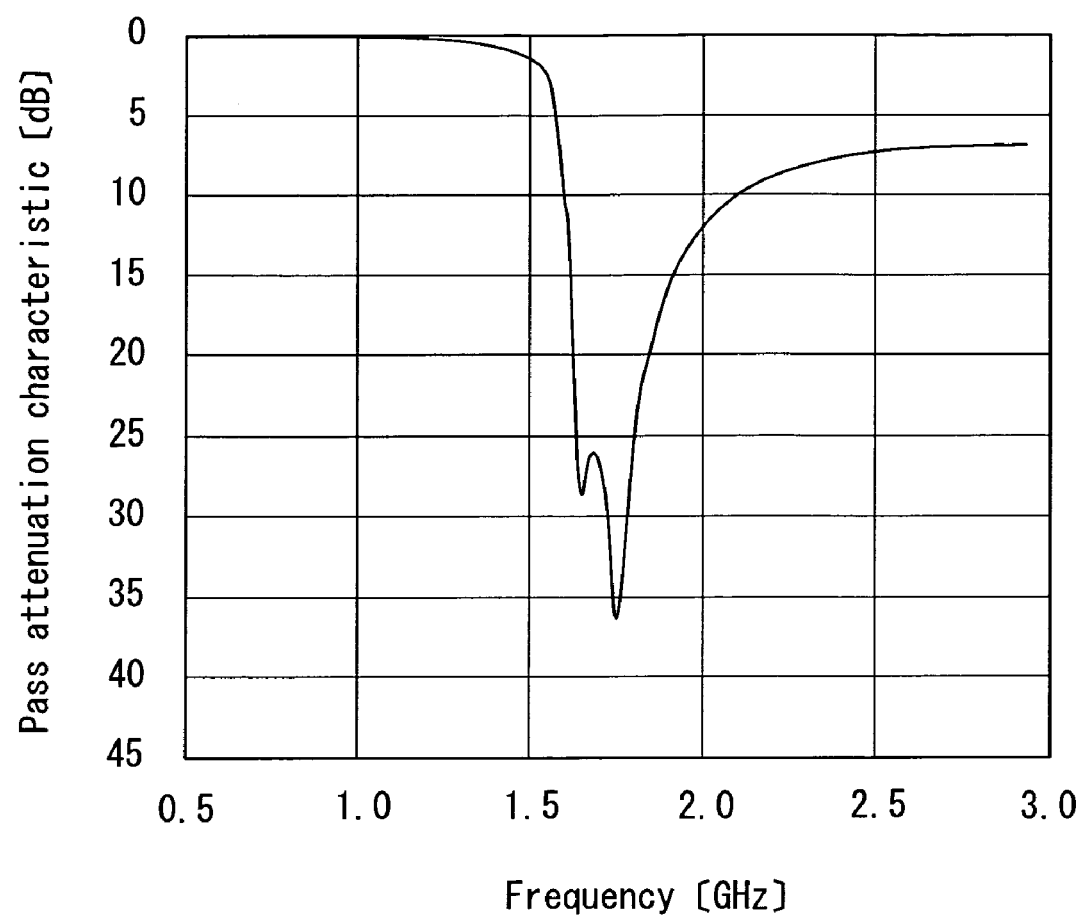
FIG. 27 is a plot illustrating the pass attenuation characteristic of a fourth model of the layered low-pass filter according to the second embodiment of the invention.
Figure 28:
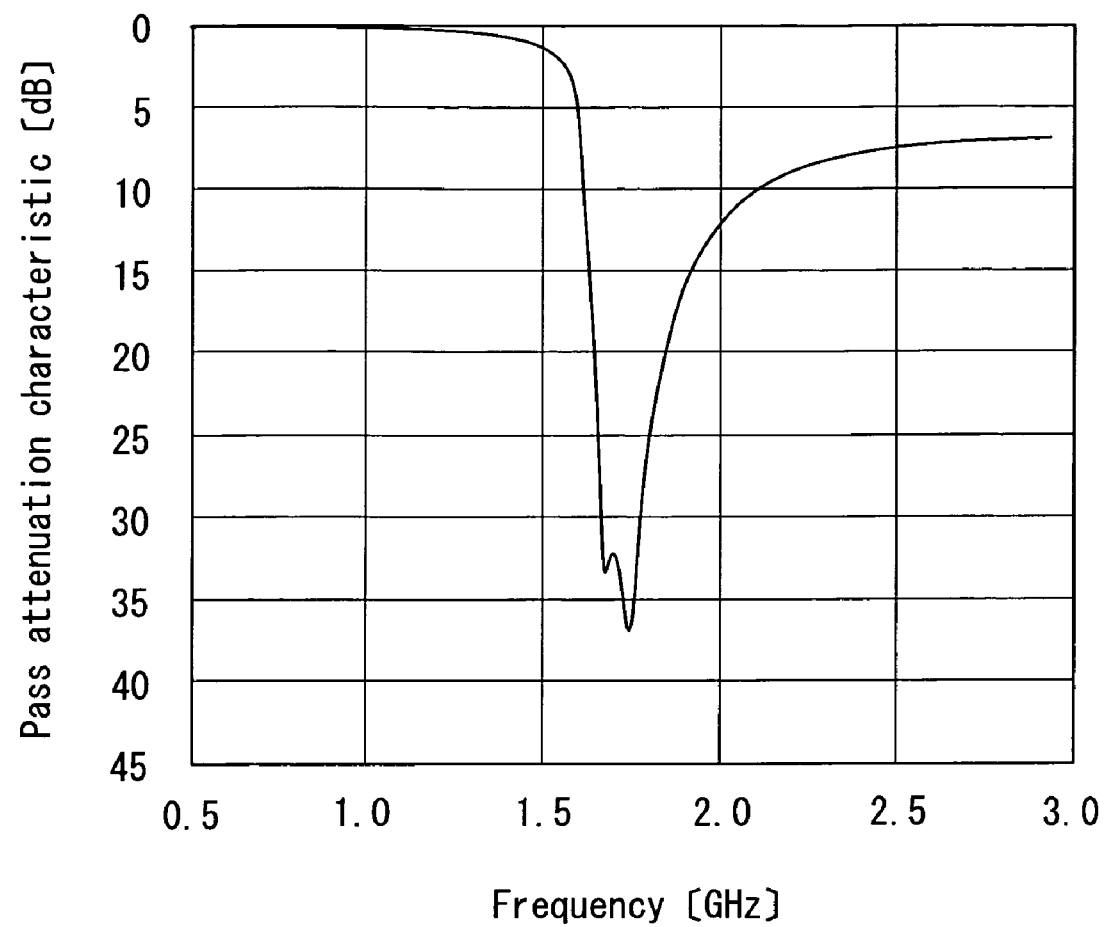
FIG. 28 is a plot illustrating the pass attenuation characteristic of a fifth model of the layered low-pass filter according to the second embodiment of the invention.
Figure 29:
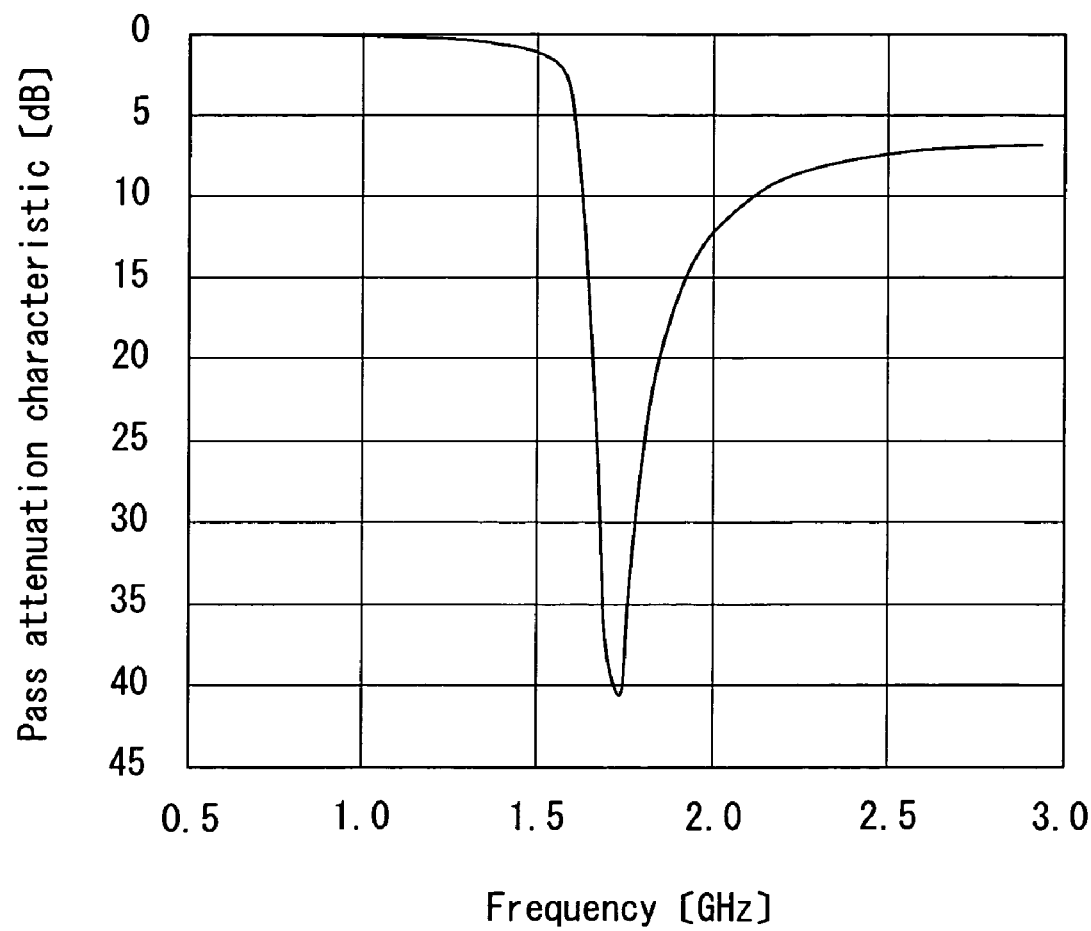
FIG. 29 is a plot illustrating the pass attenuation characteristic of a sixth model of the layered low-pass filter according to the second embodiment of the invention.

A layered low-pass filter according to a second embodiment of the invention will now be described. Reference is now made to FIG. 21 to FIG. 23 to describe the configuration of the layered low-pass filter according to the second embodiment. FIG. 21 is a perspective view illustrating the main part of the layered low-pass filter according to the second embodiment. FIG. 22 is a view illustrating the inside of the layered substrate of the second embodiment. FIG. 23 is a top view illustrating the top surface of one of the dielectric layers located within the layered substrate of the second embodiment. FIG. 22 illustrates the inside of the layered substrate as viewed from the same direction as FIG. 3.

The layered low-pass filter 501 according to the second embodiment is different from the layered low-pass filter 1 according to the first embodiment in the following respects. The layered low-pass filter 501 has a conductor layer 365 and a through hole 366 shown in FIG. 23, in place of the conductor layers 361 and 362 and the through holes 363 and 364 of FIG. 6C. The conductor layer 365 is formed on the dielectric layer 36. The through hole 353 of FIG. 6B is connected to a portion of the conductor layer 365 near its one end. The through hole 354 of FIG. 6B is connected to a portion of the conductor layer 365 near its other end. The through hole 366 is formed in the dielectric layer 36 and connected to the conductor layer 365. The through hole 366 is also connected to the through hole 372 of FIG. 7A.

In the second embodiment, the first conducting path 51 is composed of the through holes 333, 343 and 353, while the second conducting path 52 is composed of the through holes 334, 344 and 354. The conducting paths 51 and 52 are equal in length. Furthermore, in the second embodiment, the third conducting path 53 includes conducting paths 53A and 53B connected in series. The conducting path 53A is composed of the through hole 366, while the conducting path 53B is composed of the through holes 372 and 384 connected in series.

Next, a description will be made on the results of studying the effects of the length L1 of each of the conducting paths 51 and 52 and the length L2 of the conducting path 53 of FIG. 22 on the pass attenuation characteristic of the layered low-pass filter 501 by simulation. Here, by way of example, presented are the results of comparison of pass attenuation characteristics among first to sixth models of the layered low-pass filter 501 by simulation. The first to sixth models are different in length L1 of each of the conducting paths 51 and 52 and length L2 of the conducting path 53. The values of L1, L2, and L2/L1 for each of the first to sixth models are shown in Table 1 below.

TABLE 1

|  | L1 (μm) | L2 (μm) | L2/L1 |
|---|---|---|---|
| 1st model | 40 | 400 | 10 |
| 2nd model | 240 | 200 | 0.83 |
| 3rd model | 260 | 180 | 0.69 |
| 4th model | 300 | 140 | 0.47 |
| 5th model | 340 | 100 | 0.29 |
| 6th model | 380 | 60 | 0.16 |

The pass attenuation characteristics of the first to sixth models are shown in FIG. 24 to FIG. 29, respectively. As can be seen from FIG. 24 to FIG. 29, the two attenuation poles becomes closer to each other as L2 becomes smaller, and a single attenuation pole is obtained when L2 is 60 μm or smaller. To obtain a single attenuation pole, it is therefore preferred that L2 be 60 μm or smaller. Furthermore, as L2 becomes smaller, the attenuation obtained at each attenuation pole becomes greater. The third model, in which L2/L1 is 0.69, presents an attenuation of approximately 35 dB at one of the attenuation poles. The fourth model, in which L2/L1 is 0.47, presents an attenuation of approximately 36 dB at one of the attenuation poles. As a result of further performing simulation on models other than those listed in Table 1, it has been shown that an attenuation of 35 dB or greater is obtained at an attenuation pole by making L2/L1 be equal to or smaller than 0.5. Consequently, to obtain an attenuation of 35 dB or greater at an attenuation pole, it is preferred that L2 be equal to or smaller than one-half of L1. These findings also hold true for the first embodiment.

The remainder of configuration, function and effects of the second embodiment are similar to those of the first embodiment.

Third Embodiment

Figure 30:
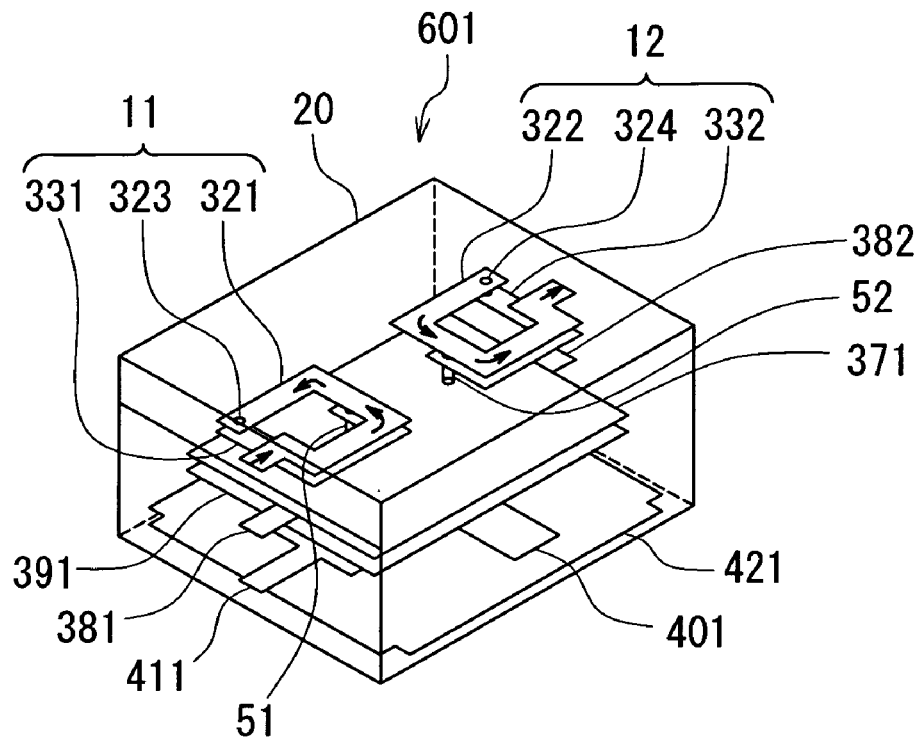
FIG. 30 is a perspective view illustrating the main part of a layered low-pass filter according to a third embodiment of the invention.
Figure 31:
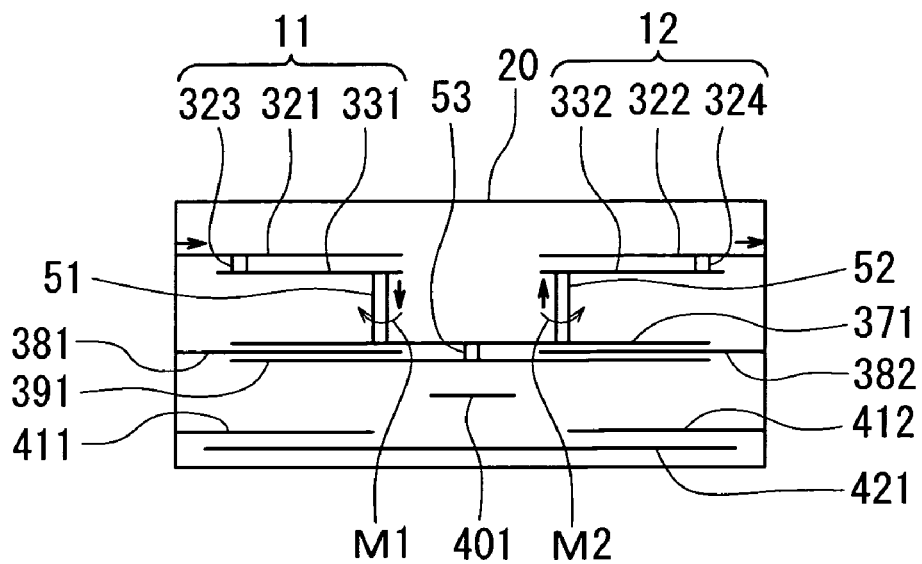
FIG. 31 is a view illustrating the inside of the layered substrate of the layered low-pass filter according to the third embodiment of the invention.

A layered low-pass filter according to a third embodiment of the invention will now be described. Reference is now made to FIG. 30 and FIG. 31 to describe the configuration of the layered low-pass filter according to the third embodiment. FIG. 30 is a perspective view illustrating the main part of the layered low-pass filter according to the third embodiment. FIG. 31 is a view illustrating the inside of the layered substrate of the third embodiment. FIG. 31 illustrates the inside of the layered substrate as viewed from the same direction as FIG. 3.

The layered low-pass filter 601 according to the third embodiment is different from the layered low-pass filter 1 according to the first embodiment in the following respects. First, the layered low-pass filter 601 according to the third embodiment is different from the layered low-pass filter 1 in the shapes of the conductor layers 321, 331 and the location of the through hole 323. Specifically, in the third embodiment, the conductor layers 321, 331 has such shapes that the conductor layers 321, 331 and the conductor layers 322, 332 are symmetric with respect to an imaginary plane located at a midpoint between the conductor layers 321, 331 and the conductor layers 322, 332. Furthermore, in the third embodiment, the through hole 323 is located at such a position that the through hole 323 and the through hole 324 are symmetric with respect to the above-mentioned imaginary plane. Consequently, in the third embodiment, as viewed from above, the conductor layer 321 extends in such a manner as to rotate in a counterclockwise direction from its one end toward its other end, and the conductor layer 331 also extends in such a manner as to rotate in a counterclockwise direction from its one end toward its other end. The through hole 323 connects the portion of the conductor layer 321 near its other end and the portion of the conductor layer 331 near its one end to each other. Consequently, the coil 11, which is composed of the conductor layers 321 and 331 and the through hole 323, extends in such a manner as to rotate in a counterclockwise direction from the input toward the output as seen from above. Thus, in the third embodiment, the direction of rotation of the coil 11 from the input toward the output and the direction of rotation of the coil 12 from the input toward the output are the same. Furthermore, in the third embodiment, the conductor layers 341, 351 and 361 and the through holes 333, 343, 353 and 363 are located at positions corresponding to the position of the other end of the conductor layer 331.

Arrows in FIG. 30 show the directions of currents flowing through the coils 11 and 12 and the conducting paths 51 and 52. In FIG. 31 the arrow marked with M1 shows the direction of the magnetic field generated by the current flowing through the conducting path 51, while the arrow marked with M2 shows the direction of the magnetic field generated by the current flowing through the conducting path 52. The other arrows in FIG. 31 show the directions of the currents flowing through the coils 11 and 12 and the conducting paths 51 and 52.

Figure 32:
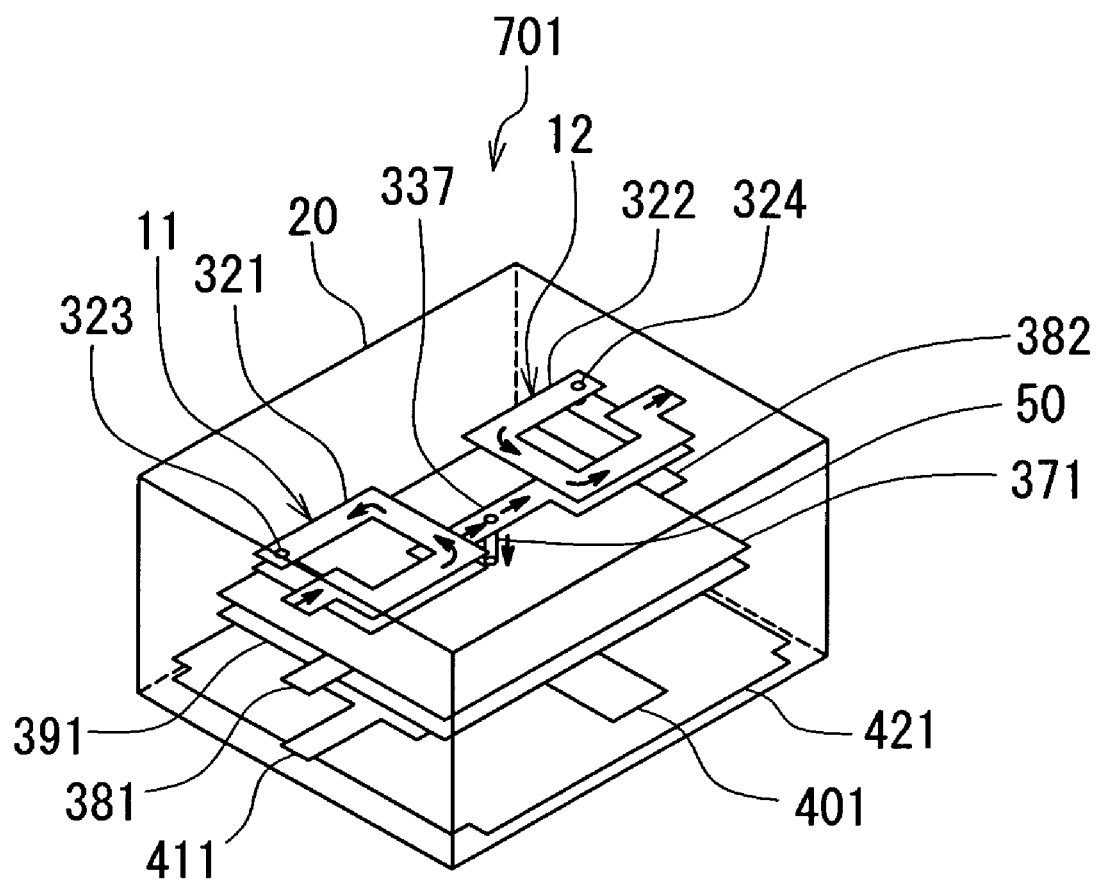
FIG. 32 is a perspective view illustrating the main part of a layered low-pass filter of a comparative example against the third embodiment of the invention.

Reference is now made to FIG. 32 to describe a layered low-pass filter 701 of a comparative example against the third embodiment. FIG. 32 is a perspective view illustrating the main part of the layered low-pass filter 701 of the comparative example. The layered low-pass filter 701 of the comparative example has a conductor layer 337 formed on the dielectric layer 33, in place of the conductor layers 331 and 332 of the layered low-pass filter 601 according to the third embodiment. The conductor layer 337 includes a portion corresponding to the conductor layer 331, a portion corresponding to the conductor layer 332, and a portion connecting the above two portions to each other. In the layered low-pass filter 701 the coil 11 is composed of the conductor layer 321, the through hole 323, and the portion of the conductor layer 337 corresponding to the conductor layer 331. In the layered low-pass filter 701 the coil 12 is composed of the conductor layer 322, the through hole 324, and the portion of the conductor layer 337 corresponding to the conductor layer 332.

The layered low-pass filter 701 has a conducting path 50 for connecting the conductor layers 337 and 371 to each other, in place of the conducting paths 51 and 52 of the layered low-pass filter 601. The conducting path 50 is formed by serially connecting through holes respectively formed one each in the dielectric layers 33, 34, 35 and 36. The conducting path 50 is connected to the conducting path 53. The remainder of configuration of the layered low-pass filter 701 is the same as that of the layered low-pass filter 601.

Arrows in FIG. 32 show the directions of currents flowing through the coils 11 and 12 and the conducting path 50. As can be seen from FIG. 32, conducting paths 51 and 52 in which the directions of currents are opposite to each other do not exist between the capacitor 13 and the coils 11, 12 in the layered low-pass filter 701.

Figure 33:
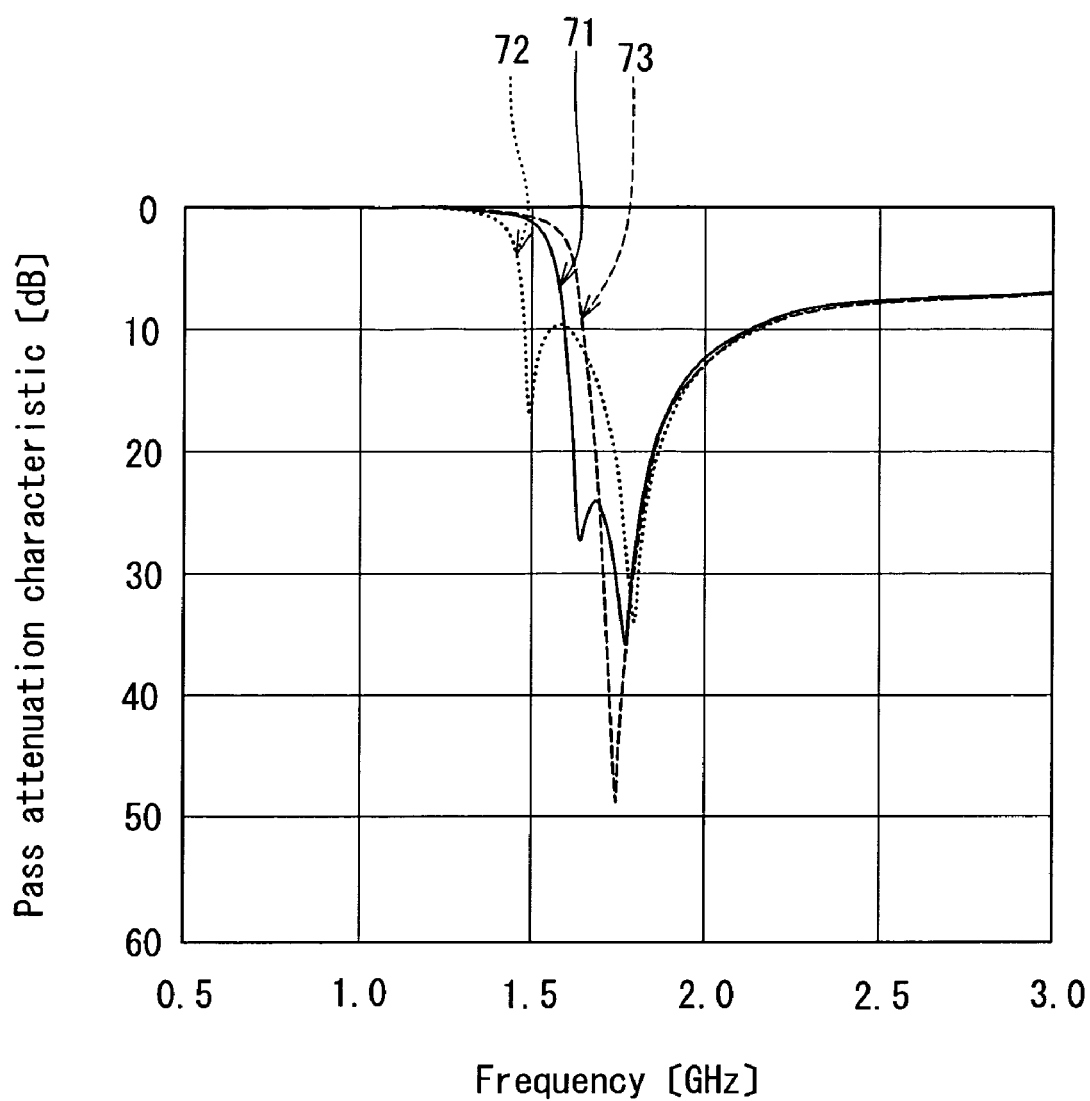
FIG. 33 is a plot illustrating the pass attenuation characteristics of the layered low-pass filter according to the first embodiment, the layered low-pass filter according to the third embodiment, and the layered low-pass filter of the comparative example against the third embodiment.

A description will now be made on the results of comparison of pass attenuation characteristics among the layered low-pass filter 1 according to the first embodiment illustrated in FIG. 1 to FIG. 3, the layered low-pass filter 601 according to the third embodiment, and the layered low-pass filter 701 of the comparative example by simulation. FIG. 33 shows the pass attenuation characteristics of the layered low-pass filters 1, 601 and 701. In FIG. 33 the solid line with numeral 71 indicates the pass attenuation characteristic of the layered low-pass filter 601 according to the third embodiment, the dotted line with numeral 72 indicates the pass attenuation characteristic of the layered low-pass filter 701 of the comparative example, and the broken line with numeral 73 indicates the pass attenuation characteristic of the layered low-pass filter 1 according to the first embodiment.

FIG. 33 shows that each of the layered low-pass filter 601 according to the third embodiment and the layered low-pass filter 701 of the comparative example has two attenuation poles in the stop band in the pass attenuation characteristic. For the third embodiment, the two attenuation poles are closer to each other and the attenuation at each of the attenuation poles is greater, compared with the comparative example. This finding indicates that, by having the two conducting paths 51 and 52 in which the directions of currents are opposite to each other, the third embodiment is capable of providing a greater attenuation at each attenuation pole appearing in the stop band in the pass attenuation characteristic, compared with the case where the capacitor 13 and the node between the coils 11 and 12 are connected via only the single conducting path 50 without any such two conducting paths 51 and 52.

The layered low-pass filter 601 according to the third embodiment presents two attenuation poles in the pass attenuation characteristic, however, in contrast to the layered low-pass filter 1 according to the first embodiment, which presents only one attenuation pole in the pass attenuation characteristic. Furthermore, the attenuation at each of the two attenuation poles of the third embodiment is smaller than the attenuation at the only one attenuation pole of the first embodiment. This indicates that, in the case where the direction of rotation of the coil 11 from the input toward the output and the direction of rotation of the coil 12 from the input toward the output are opposite to each other as in the first embodiment, it is possible to obtain a greater attenuation at an attenuation pole, compared with the case where the directions of rotation of the coils 11 and 12 from the input toward the output are the same as in the third embodiment. It is therefore preferable that the direction of rotation of the coil 11 from the input toward the output and the direction of rotation of the coil 12 from the input toward the output be opposite to each other.

The remainder of configuration, function and effects of the third embodiment are similar to those of the first embodiment.

The present invention is not limited to the foregoing embodiments but can be carried out in various modifications. For example, the layered low-pass filter of the present invention may include three or more coils connected in series. In this case, it suffices that at least two of the three or more coils are those corresponding to the first and second coils of the present invention. In the present invention, each coil may be formed using a single conductor layer or may be formed using three or more conductor layers connected via through holes. Furthermore, in the present invention, it suffices that each of the first to third conducting paths is formed using at least one through hole, and the number of the through holes constituting each conducting path can be freely chosen.

The layered low-pass filter of the present invention is useful as a low-pass filter for use in reception devices for one-segment broadcasts, for example.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered low-pass filter comprising:
   a layered substrate including a plurality of dielectric layers stacked;
   an input terminal provided on a periphery of the layered substrate and receiving signals;
   an output terminal provided on the periphery of the layered substrate and outputting the signals;
   a first coil and a second coil each of which is formed using at least one conductor layer provided within the layered substrate, the first and second coils being connected in series to each other, each of the first and second coils having an input for receiving the signals and an output for outputting the signals and, in terms of circuit configuration, the first and second coils located between the input terminal and the output terminal and the first coil being located closer to the input terminal than is the second coil;
   a capacitor formed within the layered substrate and, in terms of circuit configuration, located between a ground and a node between the first and second coils;
   a first conducting path that is formed using at least one through hole provided within the layered substrate and that is used for connecting the capacitor to the output of the first coil;
   a second conducting path that is formed using at least one through hole provided within the layered substrate and that is used for connecting the capacitor to the input of the second coil; and
   a third conducting path that is formed using at least one through hole provided within the layered substrate and that is used for connecting the capacitor to an end of each of the first and second conducting paths closer to the capacitor,
   wherein the first conducting path and the second conducting path are arranged such that directions of currents flowing through them are opposite to each other, and are magnetic-field-coupled to each other,
   the first and second conducting paths have equal lengths, and the third conducting path has a length equal to or smaller than one-half of the length of each of the first and second conducting paths, and
   the layered low-pass filter presents at least one attenuation pole in a stop band in a pass attenuation characteristic.

2. The layered low-pass filter according to claim 1, wherein the first coil and the second coil are aligned side by side in a direction orthogonal to a direction of a central axis of each of the first and second conducting paths, and each extend in such a manner as to rotate in a direction from the input toward the output, and the direction of rotation of the first coil from the input toward the output and the direction of rotation of the second coil from the input toward the output are opposite to each other.

3. The layered low-pass filter according to claim 1, wherein any conductor layer other than conductor layers connected to the first and second conducting paths is not located between the first and second conducting paths.

4. The layered low-pass filter according to claim 1, further comprising a capacitor located between the input of the first coil and the ground, a capacitor located between the output of the second coil and the ground, a capacitor connected in parallel to the first coil, and a capacitor connected in parallel to the second coil.

5. A layered low-pass filter comprising:
   a layered substrate including a plurality of dielectric layers stacked;
   an input terminal provided on a periphery of the layered substrate and receiving signals;
   an output terminal provided on the periphery of the layered substrate and outputting the signals;
   a first coil and a second coil each of which is formed using at least one conductor layer provided within the layered substrate, the first and second coils being connected in series to each other, each of the first and second coils having an input for receiving the signals and an output for outputting the signals and, in terms of circuit configuration, the first and second coils located between the input terminal and the output terminal and the first coil being located closer to the input terminal than is the second coil;
   a first capacitor formed within the layered substrate and, in terms of circuit configuration, located between a ground and a node between the first and second coils;
   a first conducting path that is formed using at least one through hole provided within the layered substrate and that is used for connecting the first capacitor to the output of the first coil;

a second conducting path that is formed using at least one through hole provided within the layered substrate and that is used for connecting the first capacitor to the input of the second coil;
a second capacitor located between the input of the first coil and the ground;
a third capacitor located between the output of the second coil and the ground;
a fourth capacitor connected in parallel to the first coil; and
a fifth capacitor connected in parallel to the second coil,
wherein the first conducting path and the second conducting path are arranged such that directions of currents flowing through them are opposite to each other, and are magnetic-field-coupled to each other, and
the layered low-pass filter presents at least one attenuation pole in a stop band in a pass attenuation characteristic.

* * * * *